United States Patent
Nobukata

(10) Patent No.: US 6,581,843 B2
(45) Date of Patent: Jun. 24, 2003

(54) RECORD MEDIUM AND DATA TRANSFERRING METHOD USING NONVOLATILE MEMORY

(75) Inventor: Hiromi Nobukata, Kanagawa (JP)

(73) Assignee: Sony Corporation (JP)

( * ) Notice: Subject to any disclaimer, the term of this patent is extended or adjusted under 35 U.S.C. 154(b) by 65 days.

(21) Appl. No.: 09/808,958

(22) Filed: Mar. 16, 2001

(65) Prior Publication Data
US 2002/0001238 A1 Jan. 3, 2002

(30) Foreign Application Priority Data
Mar. 17, 2000 (JP) ....................... 2000-076606

(51) Int. Cl.[7] .............................. G06K 19/06
(52) U.S. Cl. ................... 235/492; 235/380; 235/487
(58) Field of Search .................... 235/492, 487, 235/476, 380; 902/26, 38, 39

(56) References Cited

U.S. PATENT DOCUMENTS 5,818,029 A * 10/1998 Thomson ................. 235/486
6,340,117 B1 * 1/2002 Eisele et al. ............. 235/492
6,359,806 B1 * 3/2002 Nozoe et al. .......... 365/185.09

* cited by examiner

Primary Examiner—Daniel St.Cyr
(74) Attorney, Agent, or Firm—Rader, Fishman & Grauer PLLC; Ronald P. Kananen, Esq.

(57) ABSTRACT

A data transferring method for a nonvolatile memory composed of a flash memory. The flash memory allows a gaplessly read process to be performed unless a transfer error takes place. The flash memory comprises a first shift register, a second shift register, and a switching circuit. The first shift register stores data of the first half area of one page for a data re-transfer process in the case that a transfer error takes place. The second shift register stores data of the second half area of one page for a data re-transfer process in the case that a transfer error takes place. The switching circuit switches between output data of a memory cell array and output data of the first and second shift registers. As a result, data can be transferred at the logically maximum speed. In addition, a transfer error is detected page by page. When a transfer error is detected, the data re-transfer process is performed using the shift registers. Thus, the throughput can be suppressed from deteriorating.

7 Claims, 17 Drawing Sheets

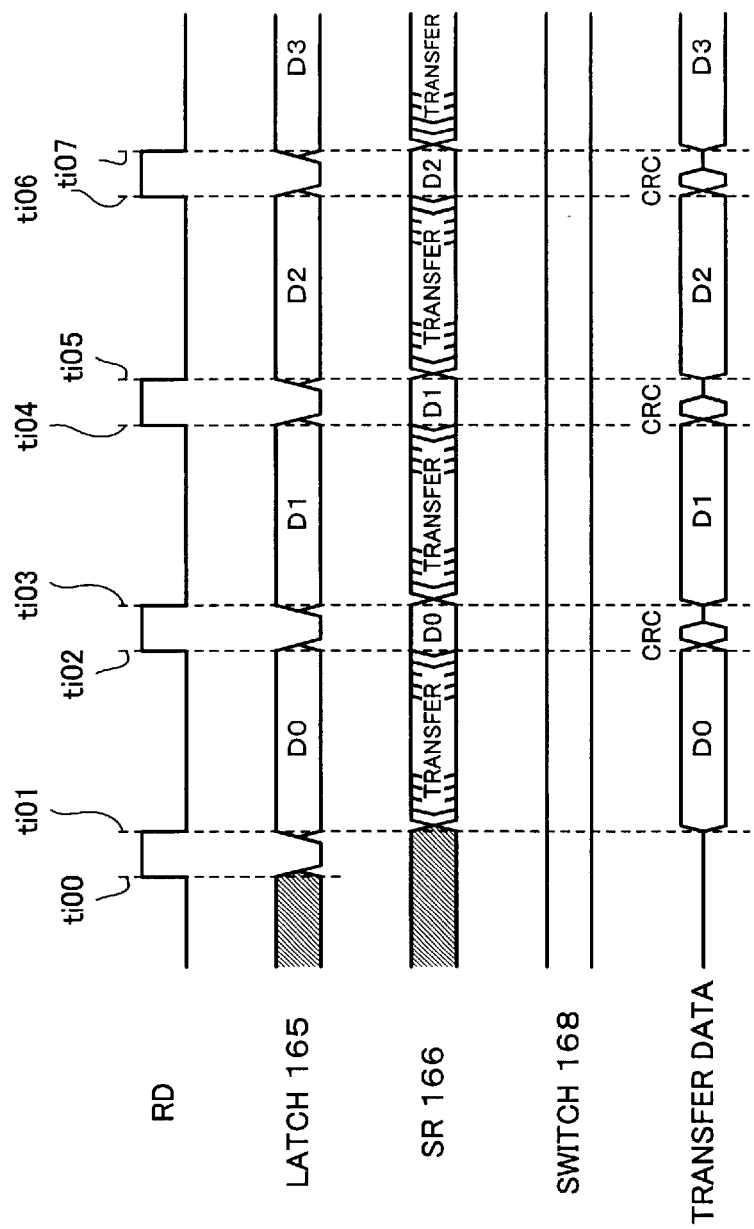

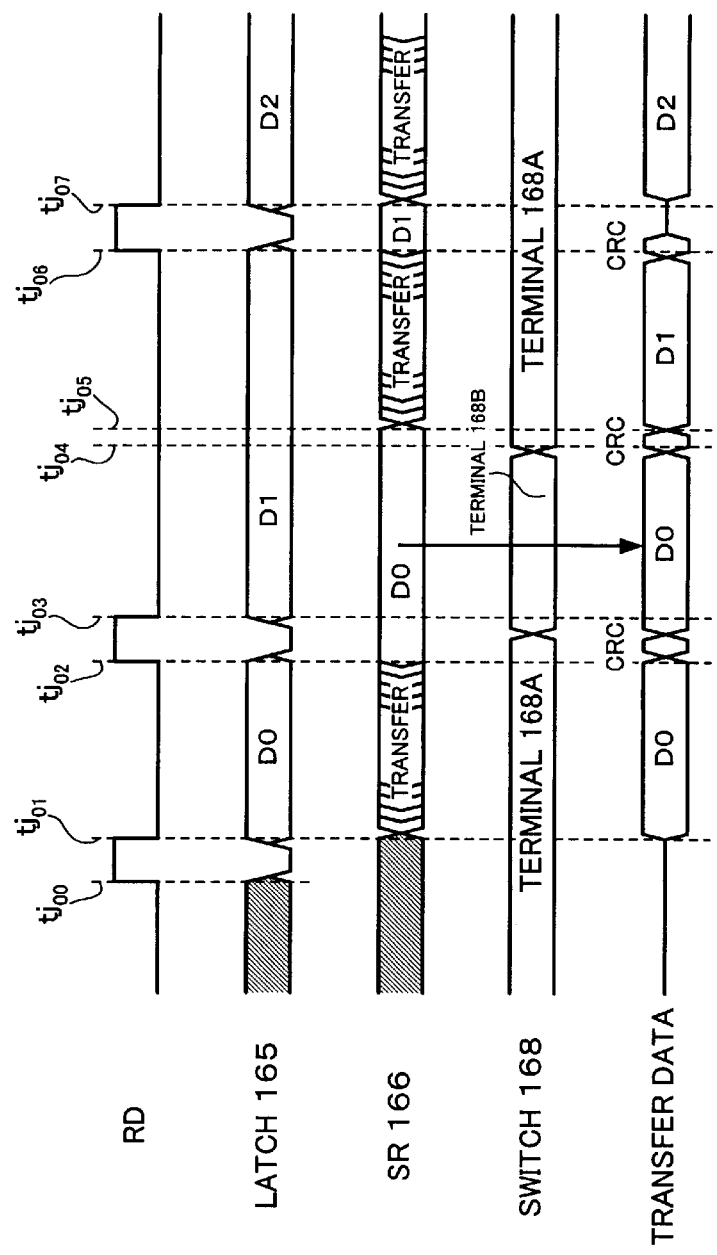

RECORD MEDIUM AND DATA TRANSFERRING METHOD USING NONVOLATILE MEMORY

BACKGROUND OF THE INVENTION

1. Field of the Invention

The present invention relates to a record medium and a data transferring method using a nonvolatile memory suitable for an IC card having a flash memory suitable for storing music data and picture data, in particular, to those that allow a data transfer rate against a host device to be improved and a circuit scale to be reduced.

2. Description of the Related Art

As a storage device that stores music data and picture data disclosed in for example Japanese Patent Laid Open Publication No. 7-311708, an IC card having a flash memory is becoming attractive. The flash memory is a nonvolatile memory that is composed of memory cell transistors each of which has a floating gate. Such an IC card comprises a memory cell array, a controller, an interface packaged in a card shaped case. The controller controls read/write processes for data from/to the memory cell array. The interface inputs and outputs data to/from a host side device. When data is transferred to the host device, CRC (Cyclic Redundancy Code) is added to the data so as to correctly transfer data to the host device and detect an error. In a NAND type flash memory, data is accessed page by page. Thus, CRC code is generated page by page. When an error is detected using the CRC code, the data re-transfer process is performed.

In FIG. 1, reference numeral 101 is an IC card. Reference numeral 102 is a host device. The IC card 101 comprises a NAND type flash memory cell array. Examples of the host device 102 are a personal computer, a digital camera, a digital audio player, and a portable terminal unit. The host device 102 and the IC card 101 are connected through a transfer path 103.

The host device 102 may have a card holding portion. By attaching the IC card 101 to the card holding portion, the IC card 101 is connected to the host device 102. Alternatively, a drive device for the IC card 101 may be disposed. In this case, the IC card 101 is attached to the drive device. The host device 102 is connected to the IC card 101 through the drive device using a cable or a radio wave.

As shown in FIG. 2, the IC card 101 comprises a memory cell array 111, a controller 112, and an interface 113. The controller 112 controls the read process of the memory cell array 111. The interface 113 inputs and outputs data to/from the host side device. A data latch 115 is disposed in association with the memory cell array 111. The controller 112 comprises a shift register 116 and a CRC calculating circuit 117. The shift register 116 has a storage capacity for data of one page.

As shown in FIG. 3, the memory cell array 111 is composed of NAND strings. Each NAND string is composed of memory cell transistors each having a floating gate. For example, each NAND string is composed of for example 16 memory cell transistors MT0 to MT15 that are tandem connected and selection gate transistors SG1 and SG2 are connected to the drain side and the source side of the memory cell transistors MT0 to MT15, respectively.

The drains of the drain side selection gate transistors SG1, SG1, and so forth are connected to bit lines BL1, BL2, and so forth, respectively. The sources of the source side selection gate transistors SG2, SG2, and so forth are connected to a source line Vs.

The gates of the memory cell transistors disposed in the line direction are connected to common word lines WL0, WL1, and WL15, respectively. The gate of the selection gate transistor SG1 is connected to a control signal line DSG. The gate of the selection gate transistor SG2 is connected to a control signal line SSG. The word lines WL0 to WL15 and the control signal lines DSG and SSG are connected to row decoders (not shown). Memory cell transistors connected to the same word lines WL0, WL1, and WL15 compose a page. The bit lines BL1, BL2, and so forth are connected to the data latch 115.

In FIG. 2, when data that is read from the IC card 101 is transferred to the host device 102 side, data for one page is accessed from the memory cell array 111 of the IC card 101. The data for one page is latched to the data latch 115. The data for one page is transferred to the shift register 116 for a data re-transfer process for data to the host device 102 in the case that a transfer error takes place.

The data transferred to the shift register 116 is sent to the host device 102 side through the CRC calculating circuit 117, the interface 113, and the transfer path 103. The data is sent from an interface 123 on the host device 102 side to the memory 124 through a CRC calculating circuit 122 and a data bus 125.

When the data for one page is transferred from the IC card 101 to the host device 102, the CRC code generated in the CRC calculating circuit 117 is sent to the host device 102 side.

The CRC calculating circuit 122 on the host device 102 side performs a CRC calculation using the received data and the CRC code and determines whether an error of the received data takes place. When the CRC calculating circuit 122 does not detect an error of the received data, as described above, data for the next page is read from the memory cell array 111 and transferred from the IC card 101 to the host device 102.

When an error is detected, the host device 102 sends a data re-transfer request to the IC card 101.

When the IC card 101 receives the data re-transfer request, the IC card 101 performs the data re-transfer process. In the data re-transfer process, data for one page stored in the shift register 116 is transferred to the host device 102 side through the transfer path 103. After the data for one page has been transferred, the CRC code generated in the CRC calculating circuit 117 is sent to the host device 102 side.

The CRC calculating circuit 122 on the host device 102 side performs the CRC calculation using the received data and the CRC code and determines whether or not an error of the received data takes place. When the CRC calculating circuit 122 does not detect an error of the received data, as described above, data for the next page is read from the memory cell array 111 and transferred from the IC card 101 to the host device 102

FIGS. 4A to 4D and 5A to 5D are timing charts showing data transferred from the IC card 101 to the host device 102. FIGS. 4A to 4D show the operation in the case that a transfer error does not take place.

FIGS. 5A to 5D show the operation in the case that a transfer error takes place.

First of all, the operation in the case that a transfer error does not take place will be described.

In FIG. 4A, a signal RD is a signal that is internally generated corresponding to a read instruction to the memory cell array 111. The signal RD causes a first access operation to be active. This instruction causes data for one page to be read from the memory cell array 111 and latched to the data latch 115.

As shown in FIG. 4A, from time tg00 to time tg01, the signal level of the signal RD becomes high. As a result, data D0 for one page is read from the memory cell array 111. As shown in FIG. 4B, at time tg01, the data D0 is latched to the data latch 115.

From time tg01 to time tg02, the data D0 is transferred from the data latch 115 to the shift register 116.

From time tg02 to time tg04, the data D0 is transferred from the shift register 116 to the host device 102. After the data D0 for one page has been transferred, the CRC code is generated in the CRC calculating circuit 117. The CRC code is transferred to the host device 102 side.

In addition, from time tg02 to time tg03, the signal level of the signal RD becomes high. As a result, data for the next page is read from the memory cell array 111. At time tg03, the data D1 is latched to the data latch 115.

At time tg04, the data D0 for one page has been transferred. After the CRC code has been transferred, the CRC calculating circuit 122 of the host device 102 performs the CRC calculation and detects an error of the received data.

When the CRC calculating circuit 122 does not detect an error of the data D0, from time tg04 to time tg05, the data D1 is transferred from the data latch 115 to the shift register 116.

From time tg05 to time tg07, the data D1 is transferred from the shift register 116 to the host device 102. After the data D1 for one page has been transferred, the CRC code generated in the CRC calculating circuit 117 is transferred to the host device 102 side.

In addition, as shown in FIG. 4A, from time tg05 to time tg06, the signal level of the signal RD becomes high. As a result, data D2 of the next page is read from the memory cell array 111. As shown in FIG. 4B, at time tg06, the data D2 is latched to the data latch 115.

Thereafter, the same operation is repeated.

FIGS. 5A to 5D show the operation in the case that a transfer error is detected.

As shown in FIG. 5A, from time th00 to time th01, the signal level of the signal RD becomes high. As a result, data D0 for one page is read from the memory cell array 111. As shown in FIG. 5B, at time th01, the data D0 is latched to the data latch 115.

As shown in FIG. 5C, from time th01 to time th02, the data D0 is transferred from the data latch 115 to the shift register 116.

From time th02 to time th04, the data D0 is transferred from the shift register 116 to the host device 102. After the data D0 for one page has been transferred, the CRC code generated in the CRC calculating circuit 117 is transferred to the host device 102 side.

In addition, from time th02 to time th03, the signal level of the signal RD becomes high. As a result, data for the next page is read as data D1 from the memory cell array 111.

After the data D0 for one page has been transferred and then the CRC code has been transferred at time th04, the CRC calculating circuit 122 of the host device 102 performs the CRC calculation and detects an error of the data D0.

When the CRC calculating circuit 122 detects an error of the data D0, as shown in FIG. 5D, from time th04 to time th05, the data D0 is transferred from the shift register 116 to the host device 102. After the data D0 for one page has been transferred, the CRC code generated in the CRC calculating circuit 117 is transferred to the host device 102 side. The host device 102 detects an error of the data D0. When the host device 102 does not detect an error of the data D0, as shown in FIG. 5C, from time th05 to time th06, the data D1 is transferred from the data latch 115 to the shift register 116.

Thereafter, the same operation is repeated.

Thus, conventionally, when data is transferred from the IC card 101 to the host device 102, for the data re-transfer process for data in the case that a transfer error takes place, while data for each page that has been read from the memory cell array 111 is stored in the shift register 116, the data is transferred from the IC card 101 to the host device 102.

In this case, when successive pages are read, the first access operation is recognized only for the first page, not other pages because the first access operation is performed while data is being transferred. Thus, when the size of one page is 512 bytes; the bus width is 8 bits; the number of bytes of the CRC code is 10 bytes; the frequency of the synchronous clock for transferring data from the IC card 101 to the host device 102 is 20 MHz; and the internal transfer rate from the data latch 115 to the shift register 116 is 20 MHz, then time necessary for outputting data for one page is expressed as follows.

$$50 \; nsec \times (512+522) = 51.7 \; \mu sec$$

Thus, the data transfer rate becomes 9.9 Mbytes/sec.

In the example shown in FIG. 2, for the data re-transfer process in the case that a transfer error takes place, data for one page that has been read from the memory cell array 111 is transferred from the data latch 115 to the shift register 116. Thereafter, the data is transferred to the host device 102 side through the transfer path 103. In this case, the data transfer time for data transferred from the data latch 115 to the shift register 116 and the data transfer time for data transferred from the shift register 116 to the host device 102 are required.

In addition, in the NAND flash memory, one page is divided into a first half area and a second half area. While the first half area is being transferred, the second half area is firstly accessed. When a plurality of pages are successively accessed, high speed read process is performed free of time for the first access operation. In other words, so-called gapless read process has been proposed (for example, Japanese Patent Laid Open Publication No. 9-106689).

However, conventionally, in the structure of which while an error is being detected using CRC code, data for each page is transferred, the gadless read process cannot be accomplished.

In addition, in the structure shown in FIG. 2, for the data re-transfer process, data received from the data latch 115 should be stored in the shift register 116. Conventionally, since data for each page is read from the shift register 116, the shift register 116 should have a storage capacity for data of one page.

Conventionally, the data amount of one page is 512 bytes. However, as the storage capacity of the flash memory increases, it is expected that the page size increases. Thus, since a conventional IC card requires a shift register having the storage capacity for one page, as the page size increases, the circuit scale adversely becomes large.

OBJECTS AND SUMMARY OF THE INVENTION

An object of the present invention is to provide a record medium and a data transferring method for use with a card system for reading data page by page and detecting an error of the data using a nonvolatile memory that allow a data re-transfer process to be performed in the case that a transfer error takes place and that allow the data transfer rate of a data transfer process including a data re-transfer process to become high.

Another object of the present invention is to provide a record medium and a data transfer method for use with a card system using a nonvolatile memory that allow data to be gaplessly read unless a transfer error is detected and that allow data to be re-transferred at high speed even if data is re-transferred in the case that a transfer error takes place.

A further object of the present invention is to provide a record medium and a data transfer method using a nonvolatile memory that allow the storage capacity of a shift register for a data re-transfer process to become small.

A first aspect of the present invention is a record medium composed of a nonvolatile memory, the nonvolatile memory having a nonvolatile memory cell array that is accessible page by page, a controlling portion for controlling the nonvolatile memory cell array, and an input/output portion for connecting the nonvolatile memory to an external device, the record medium comprising a latching means for latching data for one page that is read from the memory cell array, a shift register for storing data that is output from the latching means for a data re-transfer process in the case that a transfer error is detected, a switching means for switching between output data of the latching means and output data of the shift register, and a controlling means for transferring data for each page that is output from the memory cell array through the switching means to the external device through the input/output portion, determining whether or not a transfer error takes place in the transferred data, and performing the data re-transfer process for the data when a transfer error takes place in the transferred data, wherein when the transfer error does not take place in the transferred data, the switching means is controlled so that output data of the latching means is transferred to the external device, and wherein when the transfer error takes place in the transferred data and the data re-transfer process is performed for the transferred data, the switching means is controlled so that the data for one page stored in the shift register is transferred to the external device.

A second aspect of the present invention is a record medium composed of a nonvolatile memory, the nonvolatile memory having a nonvolatile memory cell array that is accessible page by page, a controlling portion for controlling the nonvolatile memory cell array, and an input/output portion for connecting the nonvolatile memory to an external device, the record medium comprising a first latching means for latching data of the first half area of one page read from the memory cell array, a second latching means for latching data of the second half area of one page read from the memory cell array, a controlling means for controlling a read process of the memory cell array in such a manner that while data of the first half area of one page or data of the second half area of one page is being transferred, data of the second half area of one page or data of the first half area of one page is accessed, a first shift register for storing data that is output from the first latching means for a data re-transfer process in the case that a transfer error is detected, a second shift register for storing data that is output from the second latching means for the data re-transfer process in the case that a transfer error is detected, a switching means for switching between output data of the first latching means and the second latching means and output data of the first shift register and the second shift register, and a controlling means for transferring data for each page that is output from the memory cell array through the switching means to the external device through the input/output portion, determining whether or not a transfer error takes place in the transferred data, and performing the data re-transfer process for the data when a transfer error takes place in the transferred data, wherein when the transfer error does not take place in the transferred data, the switching means is controlled so that output data of the first latching means and the second latching means is transferred to the external device, and wherein when the transfer error takes place in the transferred data and the data re-transfer process is performed for the transferred data, the switching means is controlled so that the data of the first half area of one page stored in the first shift register and the data of the second half area of one page stored in the second shift register are transferred to the external device.

A third aspect of the present invention is a record medium composed of a nonvolatile memory, the nonvolatile memory having a nonvolatile memory cell array that is accessible page by page, a controlling portion for controlling the nonvolatile memory cell array, and an input/output portion for connecting the nonvolatile memory to an external device, the record medium comprising a first latching means for latching data of the first half area of one page read from the memory cell array, a second latching means for latching data of the second half area of one page read from the memory cell array, a controlling means for controlling a read process of the memory cell array in such a manner that while data of the first half area of one page or data of the second half area of one page is being transferred, data of the second half area of one page or data of the first half area of one page is accessed, a shift register for storing data that is read from the first latching means for a data re-transfer process in the case that a transfer error is detected, a switching means for switching between output data of the first latching means and the second latching means and output data of the shift register, and a controlling means for transferring data for each page that is output from the memory cell array through the switching means to the external device through the input/output portion, determining whether or not a transfer error takes place in the transferred data, and performing the data re-transfer process for the data when a transfer error takes place in the transferred data, wherein when the transfer error does not take place in the transferred data, the switching means is controlled so that output data of the first latching means and the second latching means is transferred to the external device, and wherein when the transfer error takes place in the transferred data and the data re-transfer process is performed for the transferred data, the switching means is controlled so that the data of the first half area of one page stored in the shift register and the data of the second half area of one page stored in the second latching means are transferred to the external device.

The data for one page may be unequally divided into data of the first half area of one page and data of the second half area of one page.

A fourth aspect of the present invention is a data transferring method, comprising the steps of accessing data for one page from a memory cell array and latching the data for one page to a latching means, transferring the data for one page from the latching means to an external device and storing the data for one page to a shift register for a data re-transfer process in the case that a transfer error is detected, determining whether or not a transfer error takes place in the data for one page transferred from the latching means to the external device, transferring data for the next page to the external device when the transfer error is not detected, and transferring the data for one page stored in the shift register to the external device when the transfer error is detected.

A fifth aspect of the present invention is a data transferring method for a record medium composed of a flash memory for dividing a nonvolatile memory cell array that is accessible page by page into a first half area of one page and a second half area of one page and performing a gapless read process in such a manner that while data of the first half area of one page or data of the second half area of one page is being transferred, data of the second half area of one page or data of the first half area of one page is accessed, the method comprising the steps of accessing the data of the first half area of one page from the memory cell array and latching the data of the first half area of one page to a first latching means, transferring the data of the first half area of one page from the first latching means to an external device, storing the data of the first half area of one page to a first shift register for a data re-transfer process in the case that a transfer error is detected, accessing the data of the second half area of one page from the memory cell array, and latching the data of the second half area of one page to a second latching means, after the data of the first half area of one page has been transferred, transferring the data of the second half area of one page to the external device, storing the data of the second half area of one page to a second shift register for a data re-transfer process in the case that a transfer error is detected, and accessing data of the first half area of the next page from the memory cell array, after the data of the first half area of one page and the data of the second half area of one page have been transferred to the external device, determining whether or not a transfer error takes place in the data for one page transferred to the external device, when the transfer error is not detected, reading and transferring data for the next page, and when the transfer error is detected, transferring the data of the first half area of one page stored in the first shift register to the external device and transferring the data of the second half area of one page stored in the second shift register to the external device.

A sixth aspect of the present invention is a data transferring method for a record medium composed of a flash memory for dividing a nonvolatile memory cell array that is accessible page by page into a first half area of one page and a second half area of one page and performing a gapless read process in such a manner that while data of the first half area of one page or data of the second half area of one page is being transferred, data of the second half area of one page or data of the first half area of one page is accessed, the method comprising the steps of accessing the data of the first half area of one page from the memory cell array and latching the data of the first half area of one page to a first latching means, transferring the data of the first half area of one page from the first latching means to an external device, storing the data of the first half area of one page to a shift register for a data re-transfer process in the case that a transfer error is detected, accessing the data of the second half area of one page from the memory cell array, and latching the data of the second half area of one page to a second latching means, after the data of the first half area of one page has been transferred, transferring the data of the second half area of one page to the external device and accessing data of the first half area of the next page from the memory cell array, after the data of the first half area of one page and the data of the second half area of one page have been transferred to the external device, determining whether or not a transfer error takes place in the data for one page transferred to the external device, when the transfer error is not detected, transferring data for the next page, and when the transfer error is detected, transferring the data of the first half area of one page stored in the first shift register to the external device and transferring the data of the second half area of one page latched in the second latching means to the external device.

The data for one page may be unequally divided into data of the first half area of one page and data of the second half area of one page.

When data is not gaplessly read, a shift register and a switching circuit are disposed. The shift register stores data for one page for the data re-transfer process in the case that a transfer error takes place. The switching circuit switches between output data of a memory cell array and output data of the shift register depending on whether or not a transfer error takes place. When a transfer error does not take place, output data of the memory cell array is directly transferred. On the other hand, when a transfer error takes place, output data of the shift register is transferred. As a result, data can be transferred between the IC card and the host device at the logically maximum speed.

When data is gaplessly read, while data of the first half area of one page or data of the second half area of one page is being transferred, data of the second half area of one page or data of the first half area of one page is being firstly accessed to the memory cell array. As a result, data can be gaplessly read. In this case, a first shift register, a second shift register, and a switching circuit are disposed. The first shift register stores data of the first half area of one page for the data re-transfer process in the case that a transfer error takes place. The second shift register stores data of the second half area of one page for the data re-transfer process in the case that a transfer error takes place. The switching circuit switches between output data of the memory cell array and output data of the first and second shift registers. When a transfer error does not take place, the output data of the memory cell array is transferred. When a transfer error takes place, output data of the first and second shift registers is transferred. As a result, when data is transferred between the IC card and the host device, data can be gaplessly read at the logically maximum speed.

In addition, data of the second half area of one page is re-transferred from a data latch. As a result, the storage capacity of the shift register can be reduced to the half of one page.

In addition, one page is unequally divided. As a result, the storage capacity of the shift register can be reduced to less than the half of one page.

These and other objects, features and advantages of the present invention will become more apparent in light of the following detailed description of a best mode embodiment thereof, as illustrated in the accompanying drawings.

BRIEF DESCRIPTION OF THE DRAWINGS

FIGS. 16A to 16E are timing charts for explaining the example in the case that data is not gaplessly read; and FIGS. 17A to 17E are timing charts for explaining the example in the case that data is not gaplessly read.

DETAILED DESCRIPTION OF THE PREFERRED EMBODIMENTS

Next, with reference to the accompanying drawings, embodiments of the present invention will be described.

1. First Example of Which Data is Gaplessly Read

In the first example, when data is transferred between an IC card and a host device, a transfer error is detected using CRC code. When a transfer error takes place, a data re-transfer process is performed. In addition, when data of a plurality of pages is successively read, the data is gaplessly read. Thus, the data is read at high speed.

Figure 6:
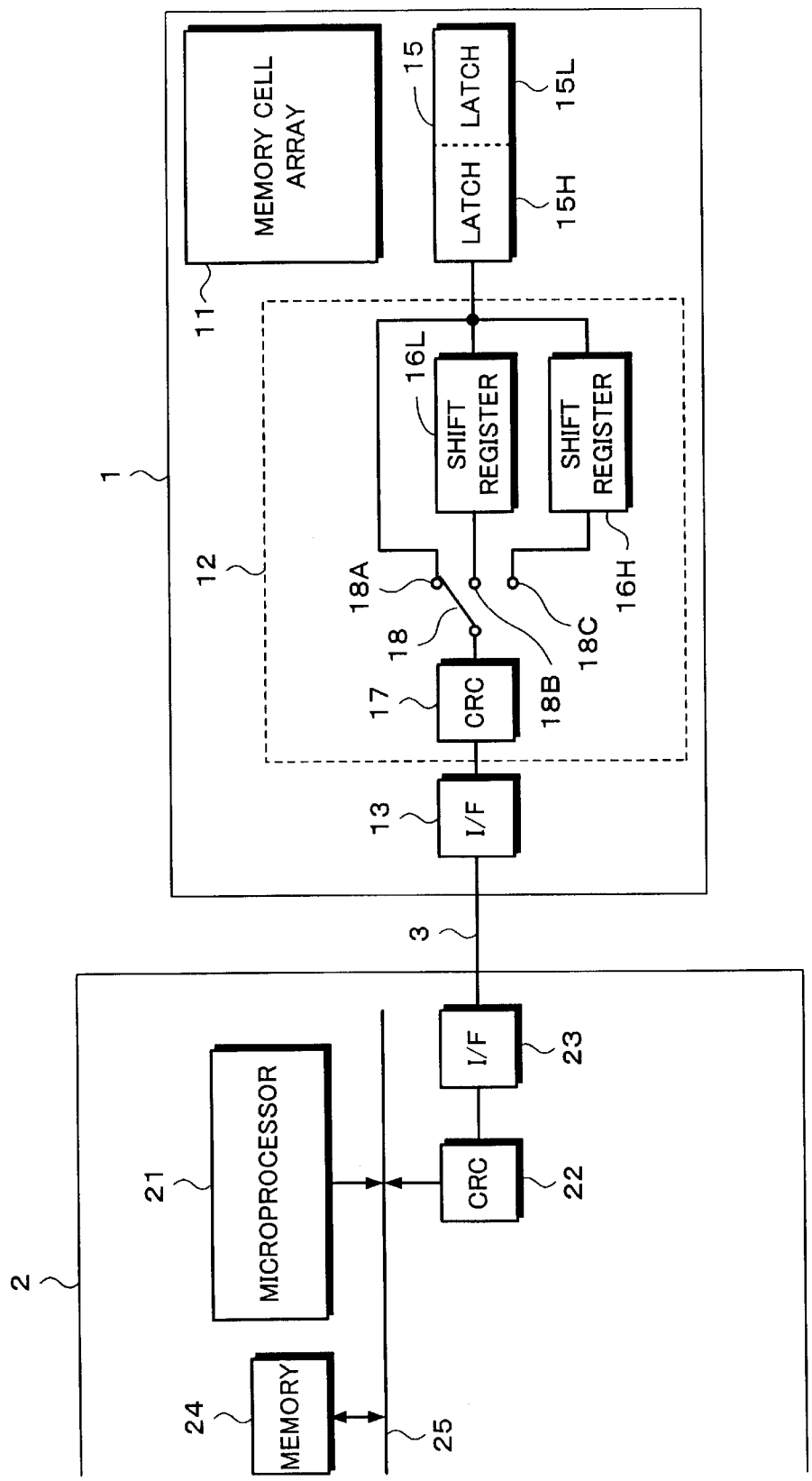
FIG. 6 is a block diagram showing a first example of the structure in the case that data is gaplessly read.

FIG. 6 shows the first example of the present invention. In FIG. 6, an IC card 1 and a host device 2 are connected through a transfer path 3. The IC card 1 is a card having a NAND type flash memory cell array. The IC card 1 comprises a memory cell array 11, a controller 12, and an interface 13.

The memory cell array 11 is composed of a NAND type flash memory. In the NAND type flash memory, data is read/written page by page. A data latch 15 is disposed in association with the memory cell array 11. The data latch 15 latches data for one page that is read from the memory cell array 11. The data latch 15 is composed of a data latch 15L and a data latch 15H that latch data of the first half area of one page and data of the second half area of one page, respectively.

When data is gaplessly read, one page is divided into two areas. When a plurality of pages are successively read, while data of one area is being transferred, the other area is firstly accessed.

The controller 12 comprises shift registers 16L and 16H, a CRC calculating circuit 17, and a switching circuit 18. For the data re-transfer process, the shift registers 16L and 16H store data of the first half area of one page and data of the second half area of one page transferred from the data latches 15L and 15H, respectively. Thus, each of the shift registers 16L and 16H has a storage capacity for ½ of data of one page.

The switching circuit 18 performs a switch process. In other words, when a transfer error does not take place in data that has been read from the memory cell array 11, the switching circuit 18 directly transfers the data received from the data latch 15 to the host device 2. In contrast, when a transfer error takes place in the data, the switching circuit 18 transfers data stored in the shift registers 16L and 16H to the host device 2.

The host device 2 is a device connected to the IC card 1. Examples of the host device 2 are a personal computer, a digital camera, a digital audio player, and a portable telephone terminal unit. The host device 2 comprises a microprocessor 21, a CRC calculating circuit 22, an interface 23, and a memory 24.

The interface 13 is disposed on the IC card 1 side. In addition, the interface 23 is disposed on the host device 2 side. The interface 13 on the IC card 1 side and the interface 23 on the host device 2 side are connected through the transfer path 3. Data is transferred between the IC card 1 and the host device 2 through the transfer path 3.

In this example, when data is read from the memory cell array 11, one page is divided into two areas. While data of one area is being transferred, the other area is firstly accessed. In such a manner, data is gaplessly read. In addition, whenever data for one page is transferred, a transfer error is detected. When a transfer error takes place, data re-transfer process is performed.

In other words, when a transfer error does not take place, the switching circuit 18 is placed on a terminal 18A side. In this case, data for one page that is read from the memory cell array 11 is sent from the data latches 15L and 15H to the host device 2 side through the switching circuit 18, the CRC calculating circuit 17, the interface 13, and the transfer path 3.

After data for one page has been transferred, the CRC code generated in the CRC calculating circuit 17 is sent to the host device 2 through the transfer path 3.

The data sent from the IC card 1 through the transfer path 3 is received by the interface 23 of the host device 2. The data is stored in the memory 24 through the CRC calculating circuit 22 and a bus 25. After data for one page has been sent from the IC card 1, the CRC code is sent.

When data for one page and CRC code are received on the host device 2 side, the CRC calculating circuit 22 of the host device 2 outputs the result of the CRC calculation. Corresponding to the result of the CRC calculation, it is determined whether or not a transfer error takes place. When a transfer error is not detected, the next page is accessed and the data thereof is transferred. When a transfer error is detected as the result of the CRC calculation, the host device 2 sends a data re-transfer request to the IC card 1.

When the IC card 1 receives the data re-transfer request, the IC card 1 performs the data re-transfer process. In the data re-transfer process, the switching circuit 18 is successively placed on a terminal 18B side and a terminal 18C side. As a result, data of the first half area of one page stored in the shift register 16L is sent to the host device 2 side. Thereafter, data of the second half area of one page stored in the shift register 16H is sent to the host device 2 side. After the data for one page has been re-transferred, the result of the CRC calculation of the CRC calculating circuit 17 is sent to the host device 2 through the transfer path 3.

When the host device 2 side receives data for one page and CRC code from the IC card 1, the CRC calculating circuit 22 of the host device 2 performs the CRC calculation. Corresponding to the result of the CRC calculation, it is determined whether or not a transfer error takes palace. When a transfer error is not detected, the switching circuit 18 is placed on the terminal 18A side. Thereafter, the next page is accessed and the data thereof is transferred.

FIGS. 7A to 7H and 8A to 8H show the operations of the first example. FIGS. 7A to 7H show the operation in the case that a transfer error is not detected. FIGS. 8A to 8H show the operation in the case that a transfer error is detected.

First of all, the operation in the case that a transfer error is not detected will be described.

Figure 7:
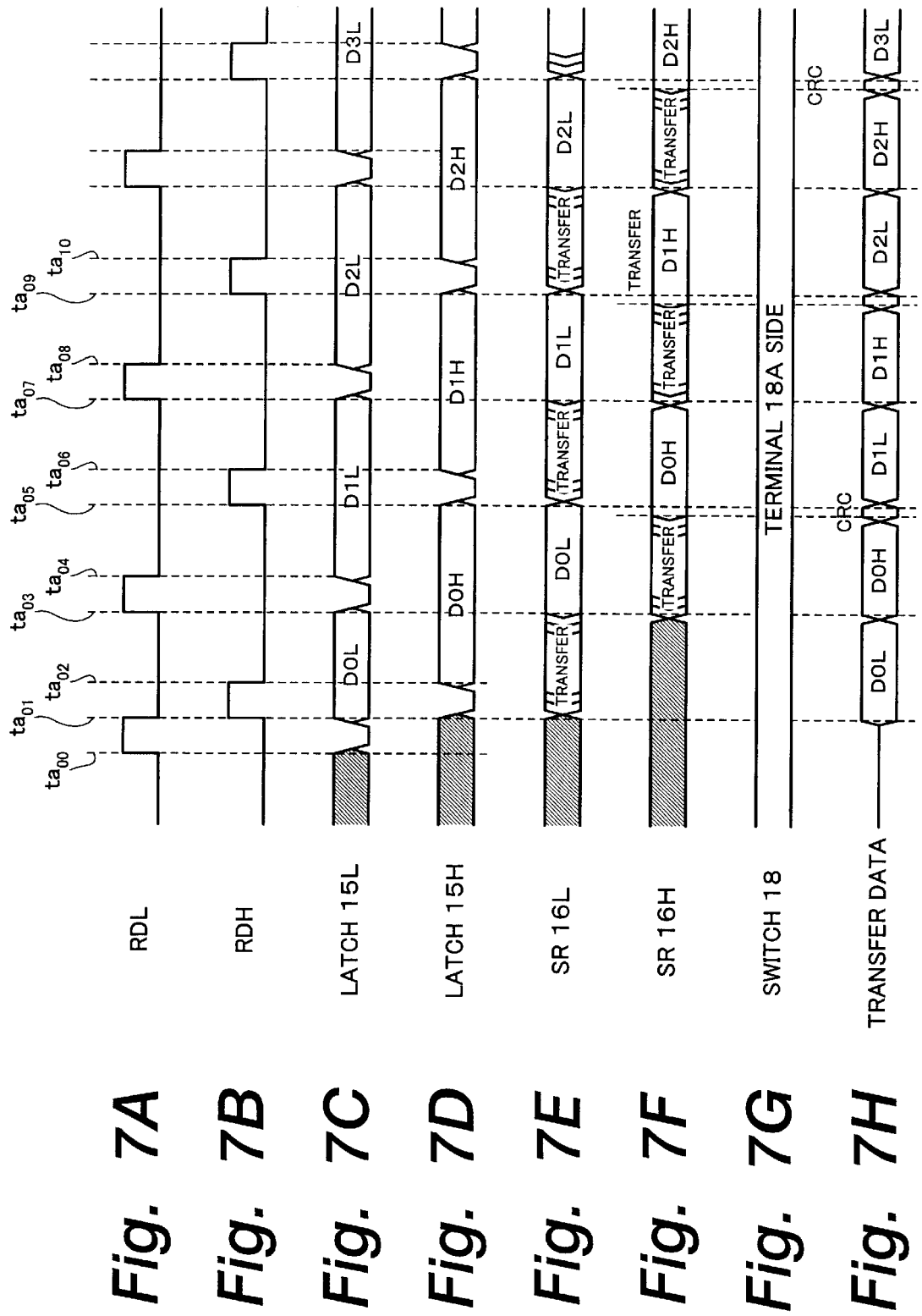
FIGS. 7A to 7H are timing charts for explaining the first example of the structure in the case that data is gaplessly read.

As shown in FIG. 7A, from time ta00 to time ta01, the signal level of a signal RDL becomes high. As a result, data of the first half area of one page is firstly accessed. Data D0L of the first half area of one page is read from the memory cell array 11. As shown in FIG. 7C, at time ta01, the data D0L is latched to the latch 15L.

At that point, as shown in FIG. 7G, the switching circuit 18 is placed on the terminal 18A side. From time ta01 to time ta03, the data D0L of the first half area of one page is sent from the latch 15L to the host device 2 side through the transfer path 3. In addition, as shown in FIG. 7E, for the data re-transfer process, the data D0L is transferred from the latch 15L to the shift register 16L.

In such a manner, from time ta01 to time ta03, the data D0L of the first half area of one page is transferred. In addition, as shown in FIG. 7B, from time ta01 to time ta02, the signal level of a signal RDH becomes high. As a result, data D0H of the second half area of one page is read from the memory cell array 11. As shown in FIG. 7D, at time ta02, the data D0H is latched to the latch 15H.

After the data D0L of the first half area of one page has been transferred at time ta03, as shown in FIG. 7H, the data D0H of the second half area of one page latched in the latch 15H is sent to the host device 2 side through the transfer path 3. In addition, as shown in FIG. 7F, for the data re-transfer process, the data D0H is transferred from the latch 15H to the shift register 16H.

In such a manner, from time ta03 to time ta05, the data D0H of the second half area of one page is transferred. In addition, from time ta03 to time ta04, the signal level of the signal RDL becomes high. As a result, data of the first half area of the next page is firstly accessed. Data D1L of the first half area of the next page is read from the memory cell array 11. At time ta04, the data D1L is latched to the latch 15L.

As shown in FIG. 7H, after the data D0L of the first half area of one page and the data D0H of the second half area of one page have been transferred, the CRC code generated in the CRC calculating circuit 17 is sent to the host device 2 side through the transfer path 3. At time ta05, data for one page has been transferred.

The host device 2 side determines whether or not a transfer error takes place using the CRC code. When the host device 2 does not detect a transfer error, the host device 2 performs the read process for the next page.

In the read process for the next page, from time ta05 to time ta07, the data D1L of the first half area of the next page latched in the latch 15L is sent to the host device 2 side through the transfer path 3. In addition, for the data re-transfer process, the data D1L is transferred to the shift register 16L.

In such a manner, from time ta05 to time ta07, the data D1L of the first half area of one page is transferred. In addition, from time ta05 to time ta06, the signal level of the signal RDH becomes high. As a result, data D1H of the second half area of the next page is read from the memory cell array 11. At time ta06, the data D1H is latched to the latch 15H.

After the data D1L of the first half area of the next page has been transferred at time ta07, the data D1H of the second half area of one page latched in the latch 15H is sent to the host device 2 side through the transfer path 3. In addition, for the data re-transfer process, the data D1H is transferred from the latch 15H to the shift register 16H.

After the data D1L of the first half area of one page and the data D1H of the second half area of one page have been transferred, the CRC code generated in the CRC calculating circuit 17 is sent to the host device 2 side through the transfer path 3. At time ta09, data for one page has been transferred.

The host device 2 side determines whether or not a transfer error takes place using the CRC code.

When the host device 2 does not detect a transfer error, the host device 2 performs the read process for the next page.

Next, the operation in the case that a transfer error is detected will be described.

Figure 8:
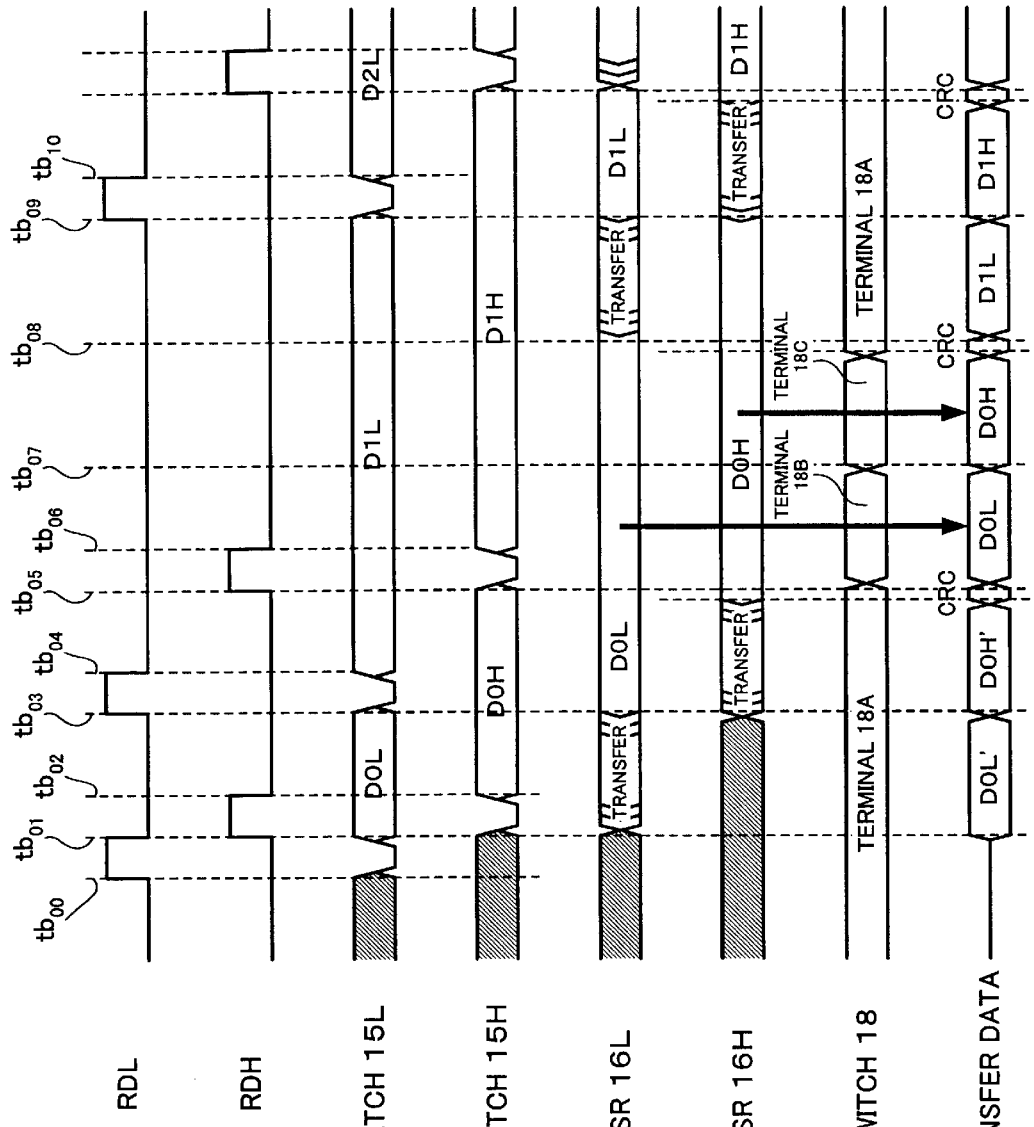
FIGS. 8A to 8H are timing charts for explaining the first example of the structure in the case that data is gaplessly read.

As shown in FIG. 8A, from time tb00 to time tb01, the signal level of the signal RDL becomes high. As a result, the data D0L of the first half area of one page is read from the memory cell array 11. As shown in FIG. 8C, at time tb01, the data D0L is latched to the latch 15L.

As shown in FIG. 8H, from time tb01 to time tb03, the data D0L of the first half area of one page is sent from the data latch 15L to the host device 2 side through the transfer path 3. In addition, as shown in FIG. 8E, for the data re-transfer process, the data D0L is transferred from the data latch 15L to the shift register 16L.

In such a manner, from time tb01 to time tb03, data of the first half area of one page is transferred. In addition, as shown in FIG. 8B, from time tb01 to time tb02, the signal level of the signal RDH becomes high. As a result, the data D0H of the second half area of one page is read from the memory call array 11. As shown in FIG. 8D, at time tb02, the data D0H is latched to the latch 15H.

After the data D0L of the first half area of one page has been transferred at time tb03, the data D0H of the second half area of one page latched in the latch 15H is sent to the host device 2 side through the transfer path 3. In addition, as shown in FIG. 8F, for the data re-transfer process, the data D0H is transferred from the latch 15H to the shift register 16H.

While data of the second half area of one page is being transferred from time tb03 to time tb05, the signal level of the signal RDL becomes high from time tb03 to time tb04. As a result, the data D1L of the first half area of the next page is read from the memory cell array 11. At time tb04, the data D1L is latched to the latch 15L.

After the data D0L of the first half area of one page and the data D0H of the second half area of one page have been transferred, the CRC code generated in the CRC calculating circuit 17 is sent to the host device 2 side through the transfer path 3. At time tb05, data for one page has been transferred.

The host device 2 side determines whether or not a transfer error takes place using the CRC code. When the host device 2 side detects a transfer error, the host device 2 side sends a data re-transfer request to the IC card 1 side.

When the host device 2 side detects a transfer error and performs the data re-transfer process, as shown in FIG. 8G, at time tb05, the switching circuit 18 is placed on the terminal 18B side. From time tb05 to time tb07, data of the first half area of one page stored in the shift register 16L is transferred to the host device 2 side. At time tb07, the switching circuit 18 is placed on the terminal 18C side. At time tb07, data of the second half area of one page stored in the shift register 16H is transferred to the host device 2 side.

In addition, as shown in FIG. 8B, from time tb05 to time tb06, the signal level of the signal RDH becomes high. As a result, the data D1H of the second half area of the next page is read from the memory cell array 11. At time tb06, the data D1H is latched to the latch 15H.

After the data D0L of the first half area of one page and the data D0H of the second half area of one page have been transferred, the CRC code generated in the CRC calculating circuit 17 is sent to the host device 2 side through the transfer path 3. At time tb08, data for one page has been re-transferred.

The host device 2 side determines whether or not a transfer error takes place using the CRC code. When the host device 2 side does not detect a transfer error, the host device 2 side performs the read process for the next page.

In the above-described example, as shown in FIG. 6, the data latch 15L and the latch 15H that latch data of the first half area of one page and data of the second half area of one page, respectively, are disposed. While data of one area is being transferred, data of the other area is firstly accessed. As a result, data can be gaplessly read. In addition, for the data re-transfer process in the case that a transfer error takes place, the shift register 16L and the shift register 16H that store data of the first half area of one page and data of the second half area of one page are also disposed. When a transfer error takes place, the switching circuit 18 is successively placed on the terminal 18B side and the terminal 18C side. As a result, data of the first half area of one page and data of the second half area of one page are transferred to the host device 2 side through the switching circuit 18. Thus, while data is being gaplessly read, it is determined whether or not a transfer error takes place using the CRC code. When a transfer error is detected, the data re-transfer process is performed.

2. Second Example of Which Data is Gaplessly Read

Figure 9:
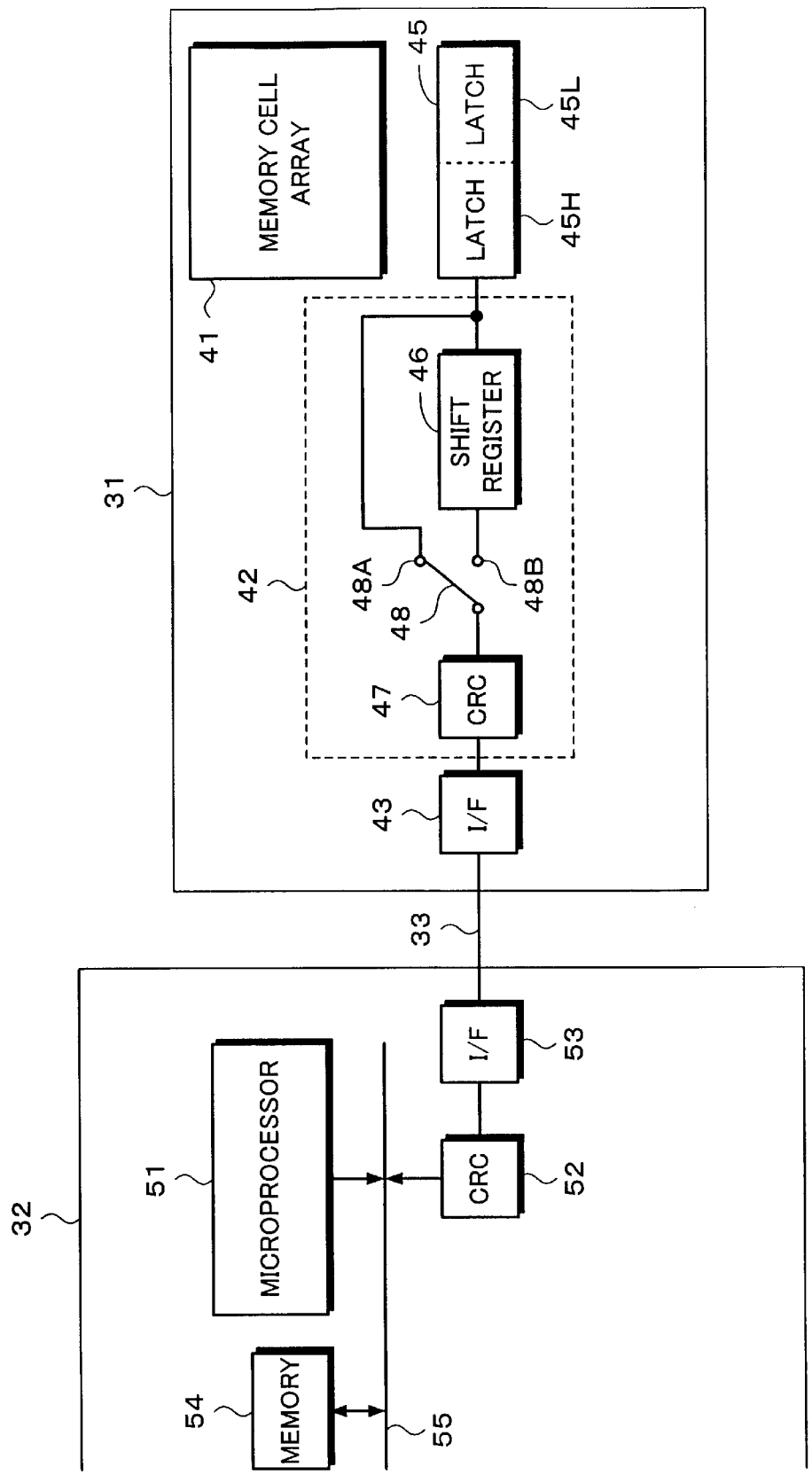
FIG. 9 is a block diagram showing a second example of the structure in the case that data is gaplessly read.

FIG. 9 shows a second example of the present 25 invention. In the example shown in FIG. 6, two shift registers 16L and 16H are disposed for a data re-transfer process. In contrast, in the example shown in FIG. 9, one shift register 46 is disposed for a data re-transfer process.

In the structure shown in FIG. 9, the read process for data of the second half area of one page is performed depending on a CRC determination result. When a transfer error is detected using CRC code, the read process for data of the next half area of one page is not performed. At that point, since data is stored in the shift register 46, the data can be re-transferred. When a transfer error is not detected with the CRC code, the read process for data of the second half area of the next page is performed. This operation is sufficiently performed while data of the first half area of the next page is being output. As a result, a shift register that stores data of the first half area of one page is not required.

When one page is composed of 512 bytes and the transfer rate is 20 MHz, time T necessary for transferring data of the first half area of one page is expressed as follows.

$$T = 50\ nsec \times 256 = 12.8\ \mu sec$$

On the other hand, time necessary for the first access operation is for example 5 μsec. Thus, while data of the first half area of one page is being re-transferred, data of the second half area of one page can be completely accessed.

In the example shown in FIG. 9, when data is read from a memory cell array 41, one page is divided into two areas. While data of one area is being transferred, data of the other area is firstly accessed. As a result, data is gaplessly read.

When a transfer error does not take place, a switching circuit 48 is placed on a terminal 48A side. As a result, data for one page that is read from the memory cell array 41 is sent from latches 45L and 45H to a host device 32 side through the switching circuit 48, a CRC calculating circuit 47, the interface 43, and a transfer path 33. In addition, data of the first half area of one page is transferred and stored to the shift register 46.

After data for one page has been transferred, CRC code generated in the CRC calculating circuit 47 is sent to the host device 32 through the transfer path 33.

When the host device 32 side receives data for one page and CRC code, a CRC calculating circuit 52 of the host device 32 performs a CRC calculation. Corresponding to the result of the CRC calculation, the host device 32 determines whether or not a transfer error takes place. When a transfer error does not take place as the result of the CRC calculation, the next page is accessed and the data thereof is transferred. When a transfer error takes place as the result of the CRC calculation, the host device 32 sends a data re-transfer request to an IC card 31.

When the IC card 31 receives the data re-transfer request, the IC card 31 performs the data re-transfer process. In the data re-transfer process, the first access operation for data of the second half area of the next page is not performed. At that point, data of the first half area of one page has been latched in the latch 45H. In addition, the switching circuit 48 is placed on the terminal 48B side. As a result, data of the first half area of one page stored in the shift register 46 is sent to the host device 32 side. Thereafter, the switching circuit 48 is placed on the terminal 48A side. As a result, data of the second half area of one page latched in the data latch 45H is sent to the host device 32. In such a manner, data for one page is re-transferred. After data for one page has been re-transferred, the result of the CRC calculation of the CRC calculating circuit 47 is sent to the host device 32 through the transfer path 33.

When the host device 32 side receives data for one page and CRC code from the IC card 31, the CRC calculating circuit 52 of the host device 32 performs a CRC calculation. Corresponding to the result of the CRC calculation, it is determined whether or not a transfer error takes place. When a transfer error is not detected corresponding to the result of the CRC calculation, the next page is accessed and the data thereof is transferred.

FIGS. 10A to 10G and 11A to 11G show the operations of the second example of the present invention. FIGS. 10A to 10G show the operation in the case that a transfer error is not detected. FIGS. 11A to 11G show the operation in the case that a transfer error is detected.

First of all, the operation in the case that a transfer error is not detected will be described.

Figure 10:
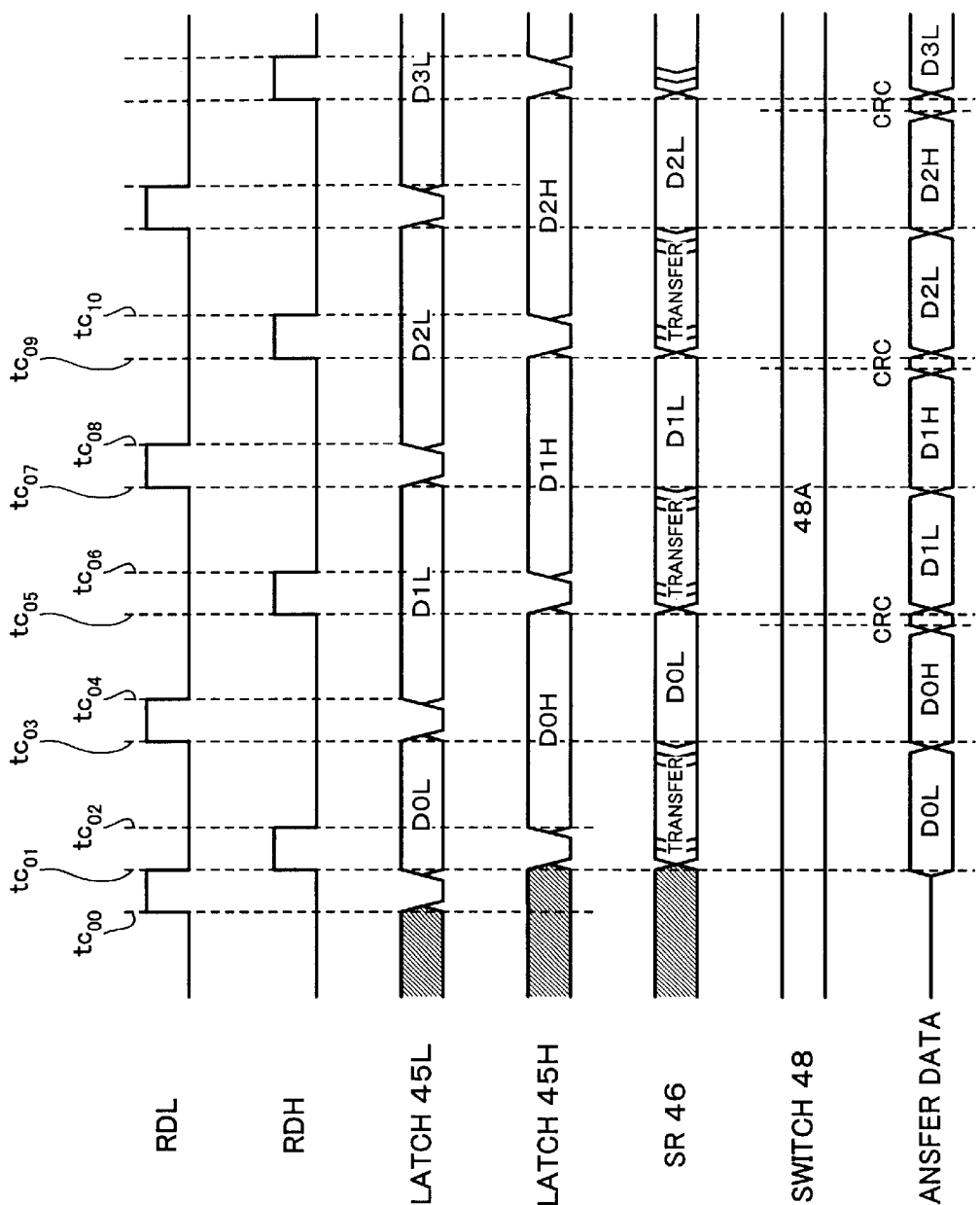
FIGS. 10A to 10G are timing charts for explaining the second example of the structure in the case that data is gaplessly read.

As shown in FIG. 10A, from time tc00 to time tc01, the signal level of the signal RDL becomes high. As a result, data of the first half area of one page is firstly accessed. The data D0L of the first half area of one page is read from the memory cell array 41. As shown in FIG. 10C, at time tc01, the data D0L is latched to the latch 45L.

As shown in FIG. 10G, the data D0L of the first half area of one page is sent to the host device 32 side through the transfer path 33. In addition, as shown in FIG. 10E, for the data re-transfer process, the data D0L is transferred from the latch 45L to the shift register 46.

While data of the first half area of one page is being transferred from time tc01 to time tc03, as shown in FIG. 10B, the signal level of the signal RDH becomes high from time tc01 to time tc02. As a result, data of the second half area of one page is firstly accessed. The data D0H of the second half area of one page is read from the memory cell array 41. As shown in FIG. 7D, at time tc02, the data D0H is latched to the latch 45H.

After the data D0L of the first half area of one page has been transferred at time tc03, the data D0H of the second half area of one page latched in the latch 45H is sent to the host device 32 side through the transfer path 33.

While data of the second half area of one page is being transferred from time tc03 to time tc05, the signal level of the signal RDL becomes high from time tc03 to time tc04. As a result, the data D1L of the second half area of the next page is read from the memory cell array 41. At time tc04, the data D1L is latched to the latch 45L.

After the data D0L of the first half area of one area and the data D0H of the second half area of one page have been transferred, CRC code generated in the CRC calculating circuit 47 is sent to the host device 32 side through the transfer path 33. At time tc05, data for one page has been transferred.

The host device 32 side determines whether or not a transfer error takes place using the CRC code. When the host device 32 does not detect a transfer error, the host device 32 performs the read process for the next page.

In the read process for the next page, from time tc05 to time tc07, the data D1L of the first half area of the next page latched in the latch 45L is sent to the host device 32 side through the transfer path 33. In addition, for the data re-transfer process, the data D1L is transferred from the latch 45L to the shift register 46.

While data of the first half area of one page is being transferred from time tc05 to time tc07, the signal level of the signal RDH becomes high from time tc05 to time tc06. As a result, data of the second half area of the next page is firstly accessed. The data D1H of the second half area of the next page is read from the memory cell array 41. At time tc06, the data D1H is latched to the latch 45H.

After the data D1L of the second half area of the next page has been transferred at time tc07, the data D1H of the second half area of the next page latched in the latch 45H is sent to the host device 32 side through the transfer path 33.

After the data D1L of the first half area of one page and the data D1H of the second half area of one page have been transferred, the CRC code generated in the CRC calculating circuit 47 is sent to the host device 32 side through the transfer path 33. At time tc09, data for one page has been transferred.

The host device 32 side determines whether or not a transfer error takes place using the CRC code. When the host device 32 does not detect a transfer error, the host device 32 performs the read process for the next page.

Next, the operation in the case that a transfer error is detected will be described.

Figure 11:
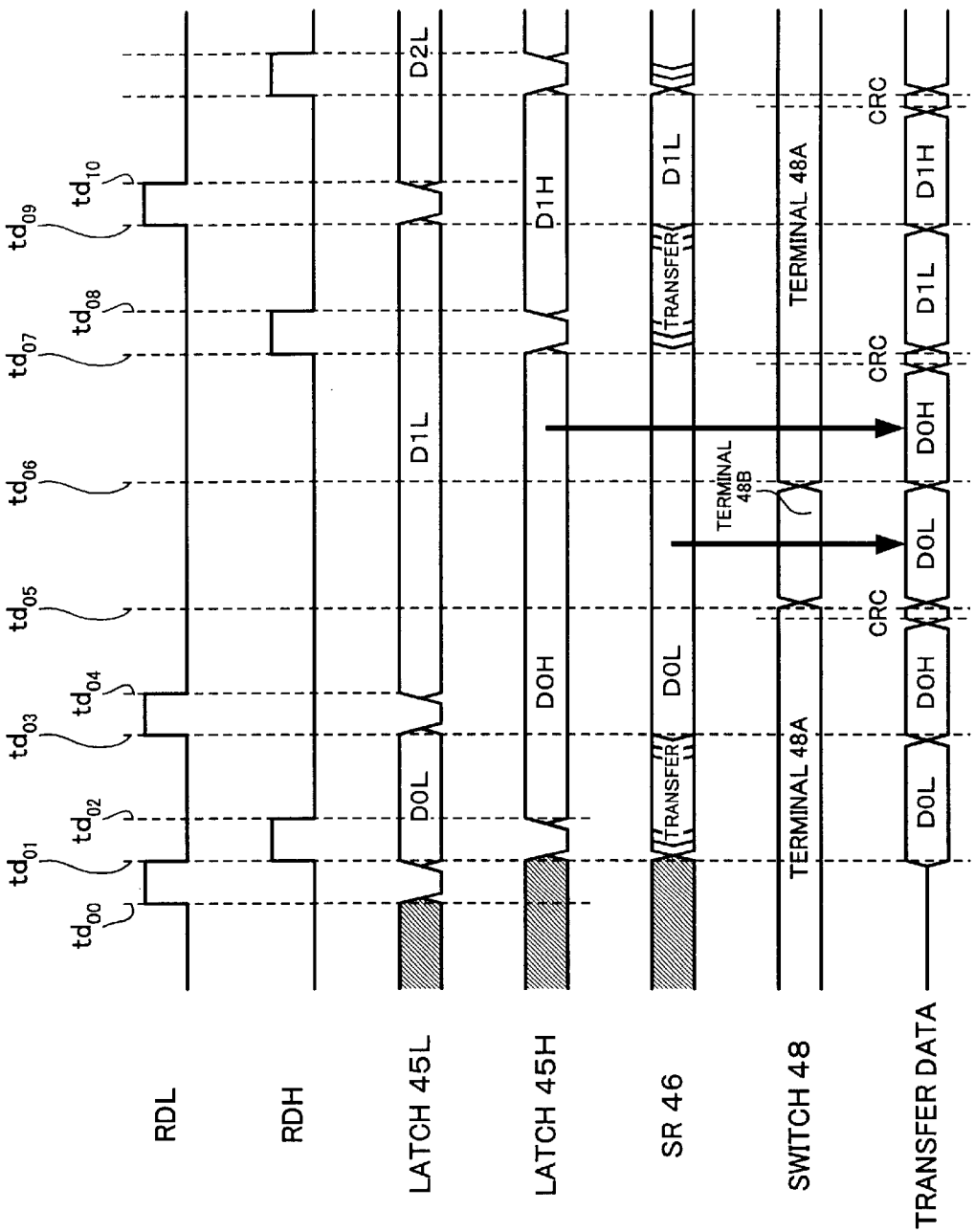
FIGS. 11A to 11G are timing charts for explaining the second example of the structure in the case that data is gaplessly read.

As shown in FIG. 11A, from time td00 to time td01, the signal level of the signal RDL becomes high. As a result, the data D0L of the first half area of one page is read from the memory cell array 41. As shown in FIG. 11C, at time td01, the data D0L is latched to the latch 45L.

As shown in FIG. 11G, from time td01 to time td03, the data D0L of the first half area of one page is sent from the latch 45L to the host device 32 side through the transfer path 33. In addition, as shown in FIG. 11E, for the data re-transfer process, the data D0L is transferred from the latch 45L to the shift register 46.

Figure 1:
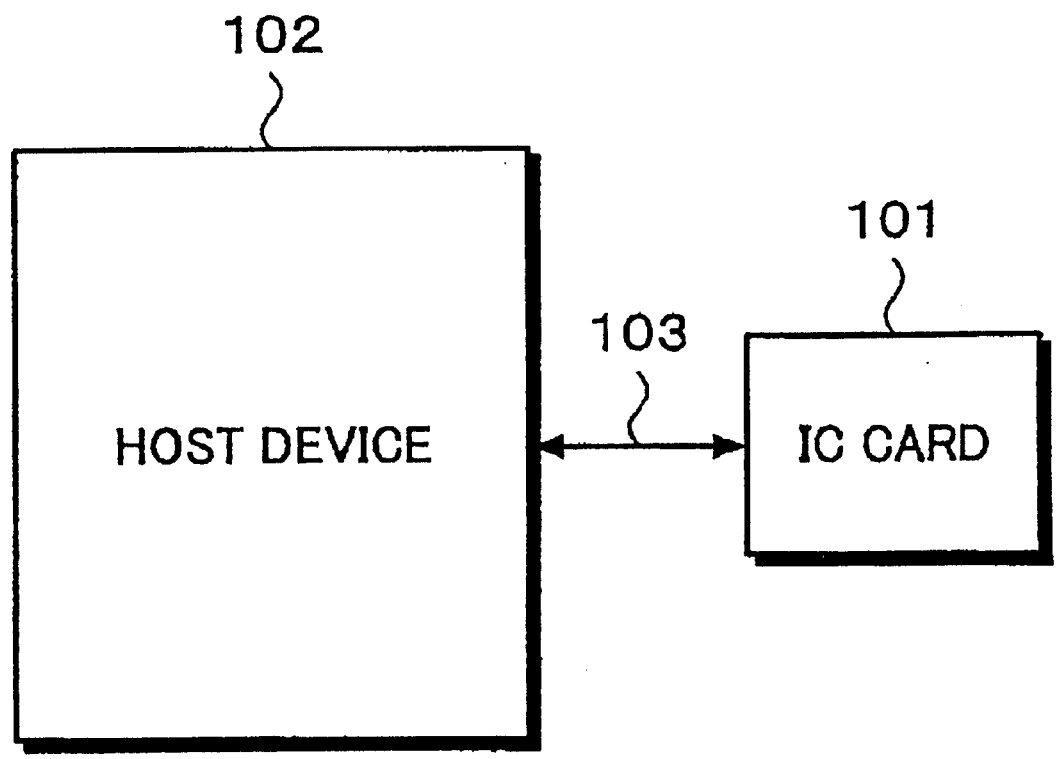
FIG. 1 is a block diagram for explaining a system using an IC card.

While data of first half area of one page is being transferred from time td01 to time td03, as shown in FIG. 11B, the signal level of the signal RDH becomes high from time td01 to time td02. As a result, the data D0H of the second half area of one page is read from the memory cell array 41. As shown in FIG. 1D, at time td02, the data D0H is latched to the latch 45H.

After the data D0L of the first half area of one page has been transferred at time td03, the data D0H of the second half area of one page latched in the latch 45H is sent to the host device 32 side through the transfer path 33.

While data of the second half area of one page is being transferred from time td03 to time td05, the signal level of the signal RDL becomes high from time td03 to time td04. As a result, the data D1L of the first half area of the next page is read from the memory cell array 41. At time td04, the data D1L is latched to the latch 45L.

After data for one page has been transferred, the CRC code generated in the CRC calculating circuit 47 is sent to the host device 32 side through the transfer path 33. At time td05, data for one page has been transferred.

The host device 32 side determines whether or not a transfer error takes place using the CRC code. When the host device 32 detects a transfer error, the host device 32 sends a data re-transfer request to the IC card 31 side.

When the data re-transfer process is performed in the case that a transfer error takes place, the first access operation for the data of the second half area of the next page is not performed. In this case, the data latched to the latch 45H is held. Thereafter, as shown in FIG. 11F, at time td05, the switching circuit 48 is placed on the terminal 48B side. From time td05 to time td06, data of the first half area of one page latched in the latch 45L is transferred to the host device 32 side. Thereafter, at time td06, the switching circuit 48 is placed on the terminal 48A side. At time td06, data of the second half area of one page is transferred from the latch 45H to the host device 32 side.

After data for one page has been transferred, the CRC code generated in the CRC calculating circuit 47 is sent to the host device 32 side through the transfer path 33. At time td07, data for one page has been re-transferred.

The host device 32 side determines whether or not a transfer error takes place using the CRC code. When the host device 32 does not detect a transfer error, the host device 32 performs the read process for the next page.

In the read process for the next page, from time td07 to time td09, the data D1L of the first half area of the next page latched in the latch 45L is sent to the host device 32 side through the transfer path 33. In addition, for the data re-transfer process, the data D1L is transferred from the latch 45L to the shift register 46.

While data of the first half area of one page is being transferred from time td07 to time td09, the signal level of the signal RDH becomes high from time td07 to time td08. As a result, data of the second half area of one page is firstly accessed. The data D0H of the second half area of one page is read from the memory cell array 41. At time td08, the data D0H is latched to the latch 45H.

After the data D1L of the first half area of the next page has been transferred at time td09, the data D1H of the second half area of one page latched in the latch 45H is sent to the host device 32 side through the transfer path 33.

Thereafter, in the same manner, the read process for the next page is performed.

In the second example of the present invention, only one shift register is disposed. On the other hand, in the first example of the present invention, two shift registers are disposed. In the second example, only when a transfer error does not take place, data for the next page is firstly accessed. In contrast, when a transfer error takes place, data is latched to the latch 45H.

When a data re-transfer request is not received and data is firstly accessed, the data transfer time of the data latch 45L is 12.8 isec. In addition, data that is firstly accessed is latched 5 isec later. Thus, even if the first access time is longer than 5 isec or the transfer clock is faster than 20 MHz, as long as the following expression is satisfied, data can be gaplessly transferred.

Transfer time for half page−first access time 0

3. Third Example of Which Data is Gaplessly Read

As was described in the second example, a data re-transfer process can be performed with one shift register 46. In the second example, the storage capacity of the shift register is data for a half page. However, it is preferred to further reduce the storage capacity of the shift register. Thus, in the third example, one page is unequally divided so that data of the first half area is smaller than data of the second half area. Since the shift register 46 stores data of the first half area of one page, when one page is unequally divided in such a manner that data of the first half area of one page is smaller than data of the second half area of one page, the storage capacity of the shift register can be reduced.

To latch data of the second half area of one page to a data latch while data of the first half area of one page is being transferred to the host device, it is necessary to satisfy the following expression.

Data transfer time of data of first half area of one page−time of first access operation 0

When the frequency of the data transfer clock is 20 MHz; the first access time is 5 isec; and the number of bytes of page data is x, then the following relation is satisfied.

50 nsec×x bytes−5 isec 0

In other words, the relation of x 100 is satisfied. This relation is irrespective of the page size.

Figure 12:
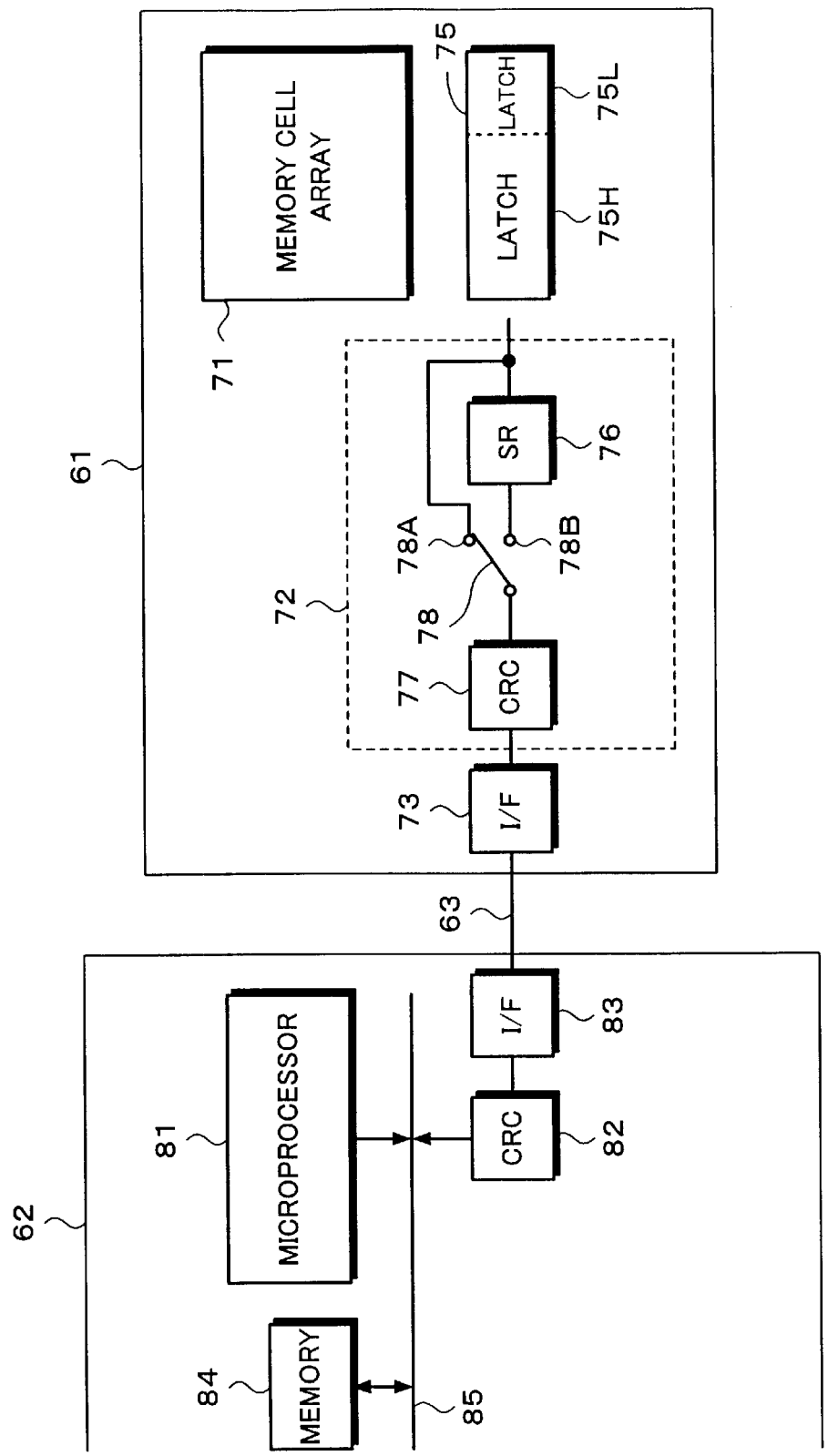
FIG. 12 is a block diagram showing a third example of the structure in the case that data is gaplessly read.

In this example, as shown in FIG. 12, the storage capacity of a data latch 75L that stores data of the first half area of one page is smaller than the storage capacity of a data latch 75H that stores data of the second half area of one page. When data is read from a memory cell array 71, one page is unequally divided into two areas.

When a transfer error does not take place, a switching circuit 78 is placed on a terminal 78A side. At that point, data for one page that is read from the memory cell array 71 is sent to a host device 62 side through the latches 75H and 75L, the switching circuit 78, a CRC calculating circuit 77, an interface 73, and a transfer path 63. In addition, data of the first half area of one page is transferred and stored to a shift register 76. The storage capacity of the shift register 76 is equal to the storage capacity of the latch 75L.

After data for one page has been transferred, CRC code is sent from the CRC calculating circuit 77 to the host device 62 through the transfer path 63.

Data sent from an IC card 61 through the transfer path 63 is received by an interface 83 of the host device 62. A CRC calculating circuit 82 performs a CRC calculation. In addition, the data sent from the IC card 61 is stored in a memory 84 through a bus 85. Thereafter, CRC code is sent.

After data has been transferred, as the result of the CRC calculation, it is determined whether or not a transfer error takes place. As the result of the CRC calculation, when a transfer error is not detected, the next page is accessed and the data thereof is transferred. As the result of the CRC calculation, when a transfer error is detected, the host device 62 sends a data re-transfer request to the IC card 61.

When the IC card 61 receives the data re-transfer request, the IC card 61 performs the data re-transfer process. At that point, since data of the first half area of one page is stored to the shift register 76, whereas data of the second half area of one page is latched to the latch 75H. Thus, data of the first half area of one page and data of the second half area of one page are transferred from the shift register 76 and the latch 75H to the host device 62 First of all, the switching circuit 78 is placed on a terminal 78B side. As a result, data of the first half area of one page stored in the shift register 76 is sent to the host device 62 side. Thereafter, the switching circuit 78 is placed on the terminal 78A side. As a result, data of the second half area of one page latched in the latch 75H is sent to the host device 62. After data for one page has been re-transferred, the result of the CRC calculation is sent to the host device 62 through the transfer path 63.

When the host device 62 side receives data for one page and CRC code from the IC card 61, the CRC calculating circuit 82 performs a CRC calculation and determines whether or not a transfer error takes place using the CRC code. When the host device 62 does not detect a transfer error as the result of the CRC calculation, the next page is accessed and the data thereof is transferred.

As described above, in the third example of the present invention, the storage capacity of the data latch 75L is smaller than the storage capacity of the data latch 75H. Thus, one page is unequally divided. However, data is re-transferred without need to re-access the memory. In this case, the storage capacity of the shift register 76 that stores data of the first half area of one page is smaller than the storage capacity of ½ page. Except for these points, the basic operation of the third example is the same as that of the second example.

FIGS. 13A to 13G and 14A to 14G show the operations of the third example of the present invention. FIGS. 13A to 13G show the operation in the case that a transfer error is not detected. FIGS. 14A to 14G show the operation in the case that a transfer error is detected.

In this example, one page is composed of 512 bytes. The storage capacity of the latch 75L is 128 bytes that are larger than 100 bytes (namely, ¼ page; transfer time is 50 nsec× 128=6.4 isec).

First of all, the operation in the case that a transfer error is not detected will be described.

Figure 13:
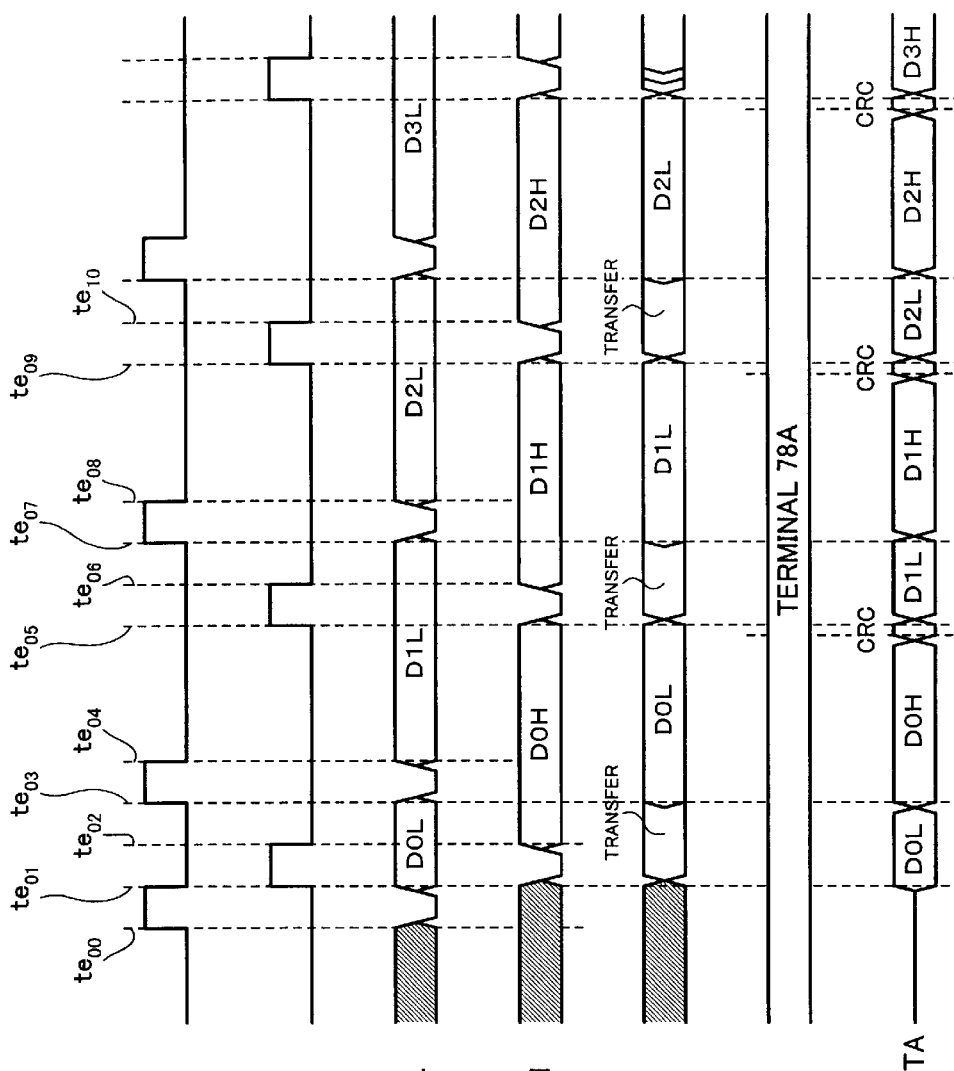
FIGS. 13A to 13G are timing charts for explaining the third example of the structure in the case that data is gaplessly read.

As shown in FIG. 13A, from time te00 to time te01, the signal level of the signal RDL becomes high. As a result, data D0L of the first half area of one page is read from the memory cell array 71. As shown in FIG. 13C, at time te01, the data D0L is latched to the latch 75L.

As shown in FIG. 13G, the data D0L of the first half area (¼ page) of one page is sent to the host device 62 side through the transfer path 63. In addition, as shown in FIG. 13E, for a data re-transfer process, the data D0L of the first half area of one page is transferred from the latch 75L to the shift register 76.

While data of first half area of one page is being transferred from time te01 to time te03, as shown in FIG. 13B, the signal level of a signal RDH becomes high from time te01 to time te02. As a result, data D0H of the second half area (¾ page) of one page is read from the memory cell array 71. As shown in FIG. 13D, at time te02, the data D0H is latched to the latch 75H.

After the data D0L of the first half area of one page has been transferred at time te03, the data D0H of the second half area of one page latched in the latch 75H is sent to the host device 62 side through the transfer path 63.

While data of the second half area of one page is being transferred from time te03 to time te05, the signal level of the signal RDL becomes high from time te03 to time te04. As a result, the data D1L of the first half area of the next page is read from the memory cell array 71. At time te04, the data D1L is latched to the latch 75L.

After data for one page has been transferred, CRC code generated in the CRC calculating circuit 77 is sent to the host device 62 side through the transfer path 63. At time te05, data for one page has been transferred.

The host device 62 side determines whether or not a transfer error takes place using the CRC code. When the host device 62 does not detect a transfer error, data for the next page is output.

Namely, from time te05 to time te07, the data D1L of the first half area of the next page is sent to the host device 62 side through the transfer path 63. In addition, as shown in FIG. 13E, for the data re-transfer process, the data D1L of the first half area of the next page is sent from the latch 75L to the shift register 76.

While data of the first half area of one page is being transferred from time te05 to time te07, the signal level of the signal RDH becomes high from time te05 to time te06. As a result, data of the second half area of the next page is firstly accessed. The data D1H of the second half area of the next page is read from the memory cell array 71. At time te06, the data D1H is latched to the latch 75H.

After the data D1L of the first half area of the next page has been transferred at time te07, the data D1H of the second half area of the next page latched in the latch 75H is sent to the host device 62 side through the transfer path 63.

After data for one page has been transferred, CRC code generated in the CRC calculating circuit 77 is sent to the host device 62 side through the transfer path 63. At time te09, data for one page has been transferred.

The host device 62 side determines whether or not a transfer error takes place using the CRC code. When the host device 62 does not detect a transfer error, the host device 62 performs the read process for the next page.

Next, the operation in the case that a transfer error is detected will be described.

Figure 14:
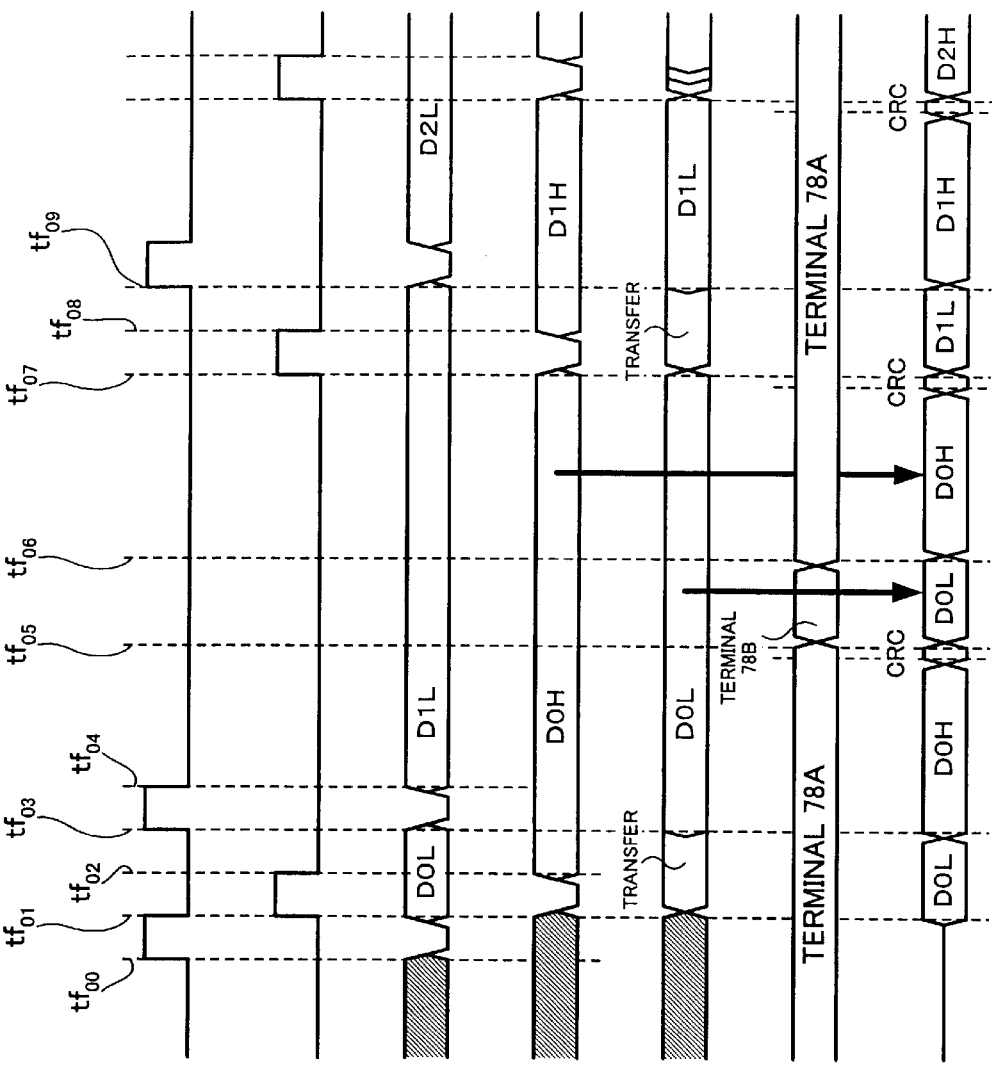
FIGS. 14A to 14G are timing charts for explaining the third example of the structure in the case that data is gaplessly read.

As shown in FIG. 14A, from time tf01 to time tf01, the signal level of a signal RDL becomes high. As a result, data D0L of the first half area of one page is read from the memory cell array 71. As shown in FIG. 14C, at time tf01, the data D0L is latched to the latch 75L.

As shown in FIG. 14G, from time tf01 to time tf03, the data D0L of the first half area of one page is sent from the latch 75L to the host device 62 side through the transfer path 63. In addition, as shown in FIG. 14E, for the data re-transfer process, the data D0L of the first half area of one page is transferred from the latch 75L to the shift register 76.

While data of the first half area of one page is being transferred from time tf01 to time tf03, as shown in FIG. 14B, the signal level of a signal RDH becomes high from time tf01 to time tf02. As a result, data D0H of the second half area of one page is read from the memory cell array 71. As shown in FIG. 14D, at time tf02, the data D0H is latched to the latch 75H.

After the data D0L of the first half area of one page has been transferred at time tf03, the data D0H of the second half area of one page latched in the latch 75H is sent to the host device 62 side through the transfer path 63.

Where data of the second half area of one page is being transferred from time tf03 to time tf05, the signal level of the signal RDL becomes high from time tf03 to time tf04. As a result, data D1L of the first half area of the next page is read from the memory cell array 71. At time tf04, the data D1L is latched to the latch 75L.

As shown in FIG. 14G, the data D0L of the first half area of one page and the data D0H of the second half area of one page are transferred to the host device 62 side. After data for one page has been transferred, CRC code generated in the CRC calculating circuit 77 is sent to the host device 62 side through the transfer path 63. At time tf05, data for one page has been transferred.

The host device 62 side determines whether or not a transfer error takes place using the CRC code. When the host device 62 detects a transfer error, the host device 62 sends a data re-transfer request to the IC card 61.

At that point, the first access operation for data of the second half area of the next page is not performed. Thus, the data latched in the latch 75H is held. As shown in FIG. 14F, at time tf05, the switching circuit 78 is placed on the terminal 78B side. From time tf05 to time tf06, data of the first half area of one page stored in the shift register 76 is transferred to the host device 62 side. Thereafter, at time tf06, the switching circuit 78 is placed on the terminal 78A side. At time tf06, data of the second half area of one page is transferred from the latch 75H to the host device 62 side.

After data for one page has been transferred, the CRC code generated in the CRC calculating circuit 77 is sent to the host device 62 side through the transfer path 63. At time tf07, data for one page has been re-transferred.

The host device 62 side determines whether or not a transfer error takes place using the CRC code. When the host device 62 does not detect a transfer error, the host device 62 performs the read process for the next page.

In the read process for the next page, as shown in FIG. 14G, from time tf07 to time tf09, the data D1L of the first half area of the next page latched in the latch 75L is sent to the host device 62 side through the transfer path 63. In addition, as shown in FIG. 14E, for the data re-transfer process, the data D1L of the first half area of the next page is transferred from the latch 75L to the shift register 76.

After the data D1L of the first half area of the next page has been transferred at time tf09, as shown in FIG. 14G, the data D1H of the second half area of one page latched in the latch 75H is sent to the host device 62 side through the transfer path 63.

Thereafter, in the same manner, the read process for the next page is performed.

As described above, in the example, the storage capacity of the data latch 75L that latches data of the first half area of one page is smaller than the storage capacity of the latch 75H that latches data of the second half area of one page. Thus, one page is unequally divided and data is gaplessly read. As a result, the size of the shift register 76 that stores data for the data re-transfer process in the case that a transfer error takes place becomes smaller than that of the shift register used in the case that one page is equally divided and data is gaplessly read.

In the above-described example, the size of one page is 512 bytes. However, as the storage capacity of a flash memory is becoming large, the size of one page tends to become large. Since the size of the shift register that stores data for the data re-transfer process in the case that a transfer error takes place depends on the size of one page, the technology for reducing the size of the shift register is very useful.

4. Example of Which Data is Not Gaplessly Read

Figure 15:
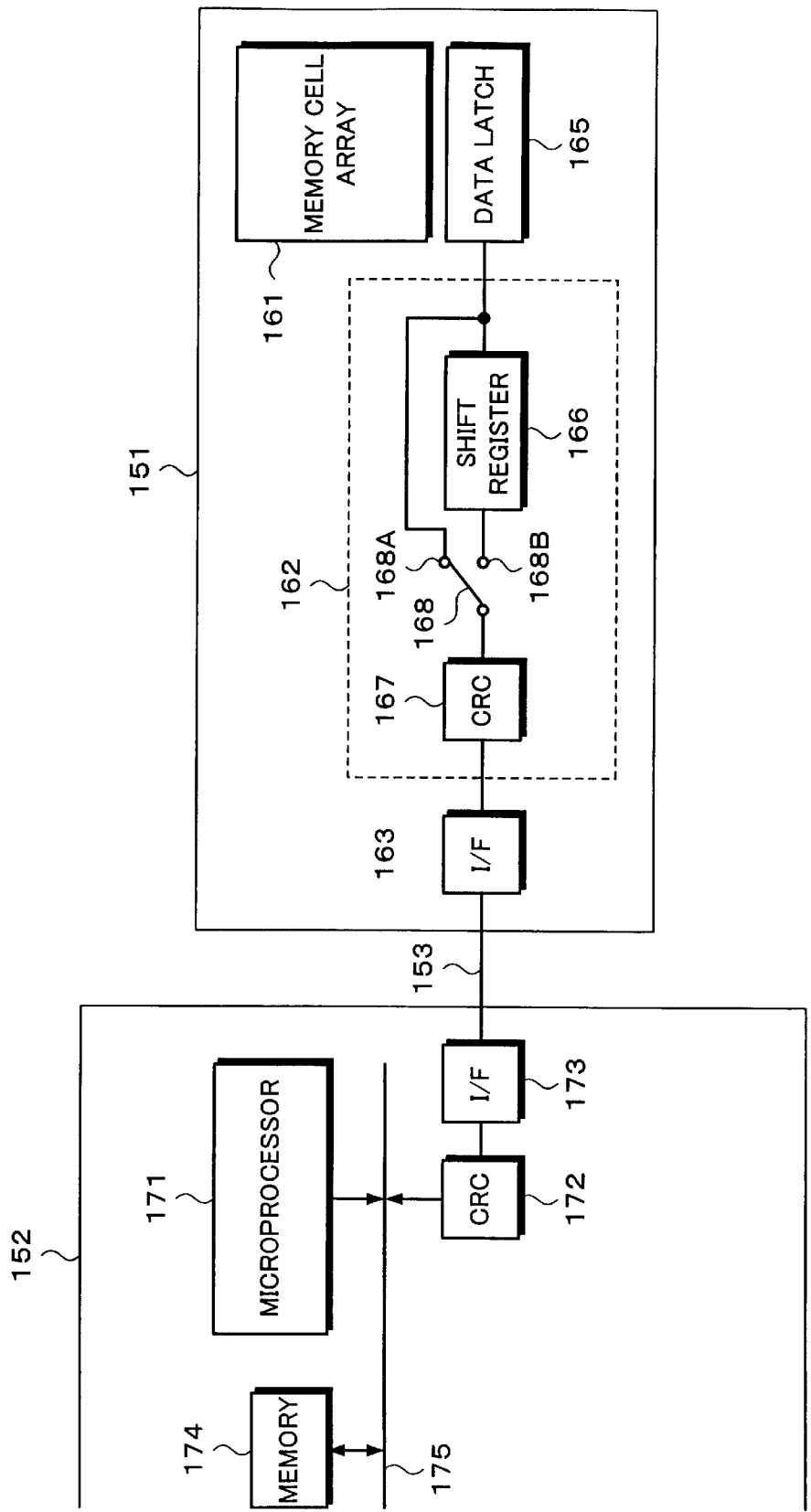
FIG. 15 is a block diagram showing an example of the structure in the case that data is not gaplessly read.

In the above-described examples, data is gaplessly read. However, when data is not gaplessly read, as shown in FIG. 15, a switching circuit 168 is disposed. The switching circuit 168 switches between output data of a data latch 165 and output data of a shift register 166. When a transfer error does not take place, the switching circuit 168 causes the output data of the data latch 165 to be directly transferred to a host device 152 side. When a transfer error takes place, the switching circuit 168 causes output data of the shift register 166 to be transferred to the host device 152 side. As a result, data can be transferred at high speed.

In FIG. 15, an IC card 151 and the host device 152 are connected through a serial transfer path 153. The IC card 151 comprises a memory cell array 161, a controller 162, and an interface 163. The memory cell array 161 is composed of a NAND type flash memory. The memory cell array 161 performs read/write processes page by page. A data latch 165 is disposed in association with the memory cell array 161. The data latch 165 latches data for one page. The controller 162 comprises the shift register 166, a CRC calculating circuit 167, and the switching circuit 168. The shift register 166 stores data for one page.

The host device 152 comprises a microprocessor 171, a memory 174, a CRC calculating circuit 172, and an interface 173.

When a transfer error does not take place, the switching circuit 168 is placed on a terminal 168A side. As a result, data for one page is accessed from the memory cell array 161 and latched to the data latch 165. The data for one page is transferred to the host device 152 side through the switching circuit 168, the CRC calculating circuit 167, and the interface 163. In addition, for the data re-transfer process in the case that a transfer error takes place, the data received from the data latch 165 is transferred to the shift register 166.

After data for one page has been transferred, CRC code generated in the CRC calculating circuit 167 is sent to the host device 152 side. The memory 174 on the host device 152 side performs a CRC calculation using the received CRC code and determines whether or not a transfer error takes place.

When a transfer error is not detected, as described above, data for the next page is read from the memory cell array 161 and transferred.

When a transfer error is detected, the host device 152 sends a data re-transfer request to the IC card 151.

When the IC card 151 receives a data re-transfer request from the host device 152, the switching circuit 168 is placed on a terminal 168B side. As a result, data for one page stored in the shift register 166 is transferred to the host device 152 side through the transfer path 153.

FIGS. 16A to 16E and 17A to 17E are timing charts showing data transfer processes performed between the IC card 151 and the host device 152.

FIGS. 16A to 16E show the operation in the case that a transfer error is not detected.

As shown in FIG. 16A, from time ti00 to time ti01, the signal level of a signal RD becomes high. As a result, data of the first half area of one page is firstly accessed. Data D0 for one page is read from the memory cell array 161. As shown in FIG. 16C, at time ti01, the data D0 is latched to the data latch 165.

At that point, as shown in FIG. 16D, the switching circuit 168 is placed on the terminal 168A side. As shown in FIG. 16E, from time ti01 to time ti02, the data D0 for one page is sent to the host device 152 side through the transfer path 153. In addition, as shown in FIG. 16C, for the data re-transfer process, the data D0 for one page is transferred from the data latch 165 to the shift register 166.

After the data D0 for one page has been transferred at time ti02, CRC code generated in the CRC calculating circuit 167 is sent to the host device 152 side through the transfer path 153. As a result, data for one page has been transferred.

From time ti03 to time ti04, the signal level of the signal RD becomes high. As a result, data D1 for the next page is read from the memory cell array 161. At time ti03, the data D1 for the next page is latched to the data latch 165.

The host device 152 side determines whether or not a transfer error takes place using the CRC code. When the host device 152 does not detect a transfer error, the next page is transferred.

From time ti03 to time ti04, data D1 for the next page latched in the data latch 165 is sent to the host device 152 side through the transfer path 153. In addition, for the data re-transfer process, the data D1 for the next page is transferred from the data latch 165 to the shift register 166.

After the data D1 for one page has been transferred at time ti04, CRC code generated in the CRC calculating circuit 167 is sent to the host device 152 side through the transfer path 153. As a result, data for one page has been transferred.

In addition, from time ti04 to time ti05, the signal level of the signal RD becomes high. As a result, data for the next page is firstly accessed. Data D2 of the next page is read from the memory cell array 161. At time ti05, the data D2 is latched to the data latch 165.

The host device 152 side determines whether or not a transfer error takes place using the CRC code. When the host device 152 does not detect a transfer error, a transfer process for the next page is performed.

In the transfer process for the next page, from time ti05 to time ti06, data D2 for the next page latched in the latch 165 is sent to the host device 152 side through the transfer path 153. In addition, for the data re-transfer process, the data D2 is transferred from the data latch 165 to the shift register 166.

Thereafter, the same process is repeated.

FIGS. 17A to 17E show the operation in the case that a transfer error is detected.

As shown in FIG. 17A, from time tj00 to time tj01, the signal level of a signal RD becomes high. As a result, data D0 for one page is read from the memory cell array 161. As shown in FIG. 17B, at time tj01, the data D0 is latched to the data latch 165.

At that point, as shown in FIG. 17D, the switching circuit 168 is placed on the terminal 168A side. As shown in FIG. 17E, from time tj01 to time tj02, the data D0 for one page is sent to the host device 152 side through the transfer path 153. In addition, as shown in FIG. 17C, for the data re-transfer process, the data D0 is transferred from the data latch 165 to the shift register 166.

After the data D0 for one page has been transferred at time tj02, the CRC code generated in the CRC calculating circuit 167 is sent to the host device 152 side through the transfer path 153. As a result, data for one page has been transferred.

In addition, from time tj02 to time tj03, the signal level of the signal RD becomes high. As a result, data D1 of the next page is read from the memory cell array 161. At time tj03, the data D1 is latched to the data latch 165.

The host device 152 side determines whether or not a transfer error takes place using the CRC code. When the host device 152 detects a transfer error, the data re-transfer process is performed.

In the data re-transfer process, the switching circuit 168 is placed on the terminal 168B side. As shown in FIG. 17E, the data D0 stored in the shift register 166 is sent to the host device 152 side through the transfer path 153.

After the data D0 for one page has been re-transferred at time tj04, the CRC code generated in the CRC calculating circuit 167 is sent to the host device 152 side through the transfer path 153. As a result, data for one page has been transferred.

The host device 152 side determines whether or not a transfer error takes place using the CRC code. When the host device 152 side does not detect a transfer error, the data transfer process for the next page is performed.

In the data transfer process for the next page, the switching circuit 168 is placed on the terminal 168A side. As a result, from time ti05 to time ti06, data D1 for the next page latched in the data latch 165 is sent to the host device 152 side through the transfer path 153. In addition, for the data re-transfer process, the data D1 is transferred from the data latch 165 to the shift register 166.

After the data D1 for one page has been transferred at time tj06, the CRC code generated in the CRC calculating circuit 167 is sent to the host device 152 side through the transfer path 153. As a result, data for one page has been transferred.

In addition, from time tj06 to time tj07, the signal level of a signal RD becomes high. As a result, data D2 for the next page is read from the memory cell array 161. At time ti07, the data D2 is latched to the data latch 165.

The host device 152 side determines whether or not a transfer error takes place using the CRC code. When the host device 152 side does not detect a transfer error, the data transfer process for the next page is performed. Thereafter, the same operation is repeated.

In the example, the switching circuit 168 is disposed so that data that is read from the memory cell array 161 is directly sent to the interface 163. When a transfer error is not detected, the switching circuit 168 is placed on the terminal 168A side. Data for one page that is read from the memory cell array 161 is directly sent from the data latch 165 to the host device 152 through the switching circuit 168, the CRC calculating circuit 167, and the transfer path 153. In addition, for the data re-transfer process, output data of the data latch 165 is stored in the shift register 166. When a transfer error is detected, the switching circuit 168 is placed on the terminal 168B side. As a result, data stored in the shift register 166 is transferred to the host device 152 through the switching circuit 168, the CRC calculating circuit 167, the interface 163, and the transfer path 153.

In such a structure, when a transfer error is not detected, while CRC code is being transferred to the host device 152, data for the next page is firstly accessed to the memory cell array 161. Since the CRC code is composed of 10 bytes, when the frequency of the transfer clock is 20 MHz, the transfer time of the CRC code is as low as 500 nsec. On the other hand, the first access operation is performed on the order of isec. Thus, the period from time ti00 to time ti01 and the period from time ti02 to time ti03, and so forth depend on the period of the first access operation.

When the period of the first access operation is 5 isec; the data size of one page is 512 bytes; the bus width is 8 bits; and the number of bytes of CRC code is 10 bytes, then the time necessary for reading data for one page is expressed as follows.

$$5 \ isec + 50 \ nsec \times 522 \ cycles = 31.1 \ isec$$

Figure 2:
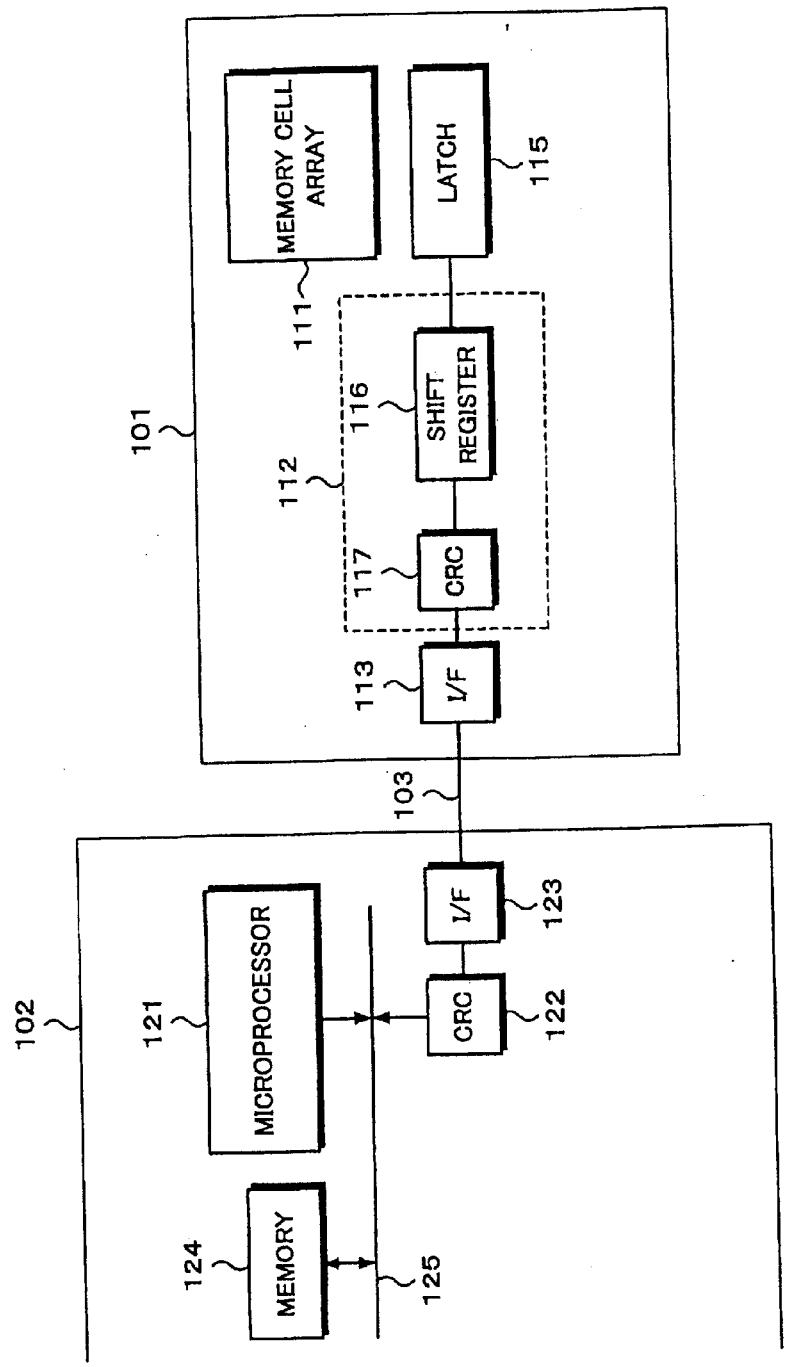
FIG. 2 is a block diagram showing an example of the structure of a transferring system using a conventional IC card.
Figure 3:
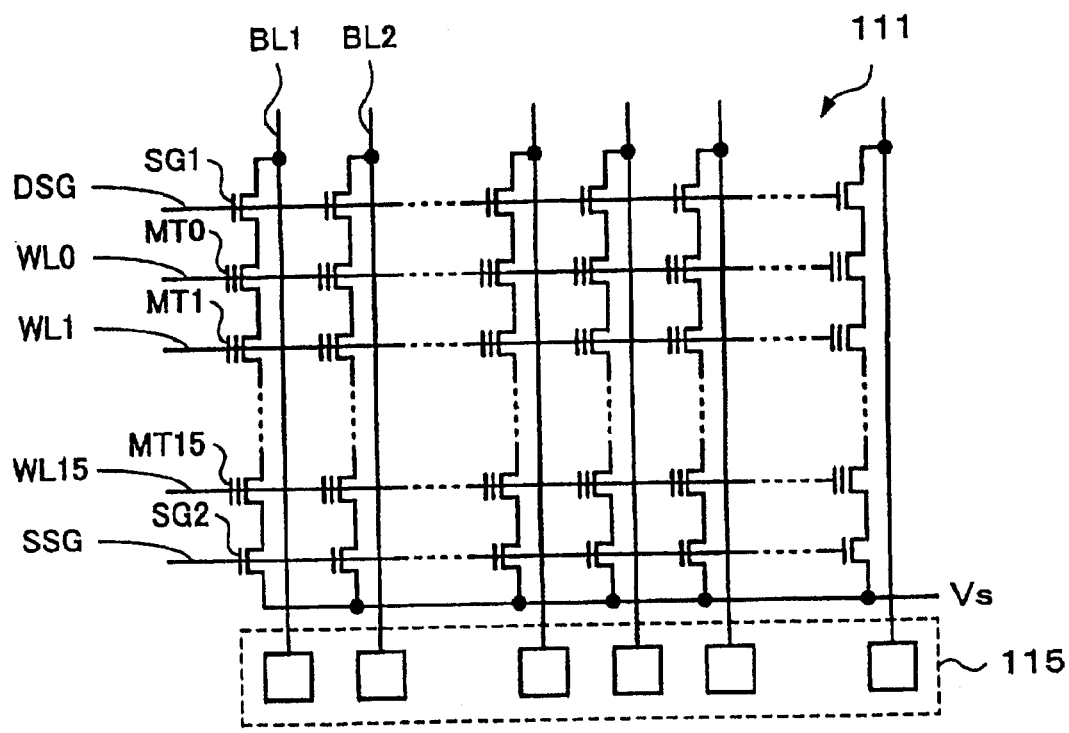
FIG. 3 is a schematic diagram showing connections for explaining an NAND flash memory.
Figure 4:
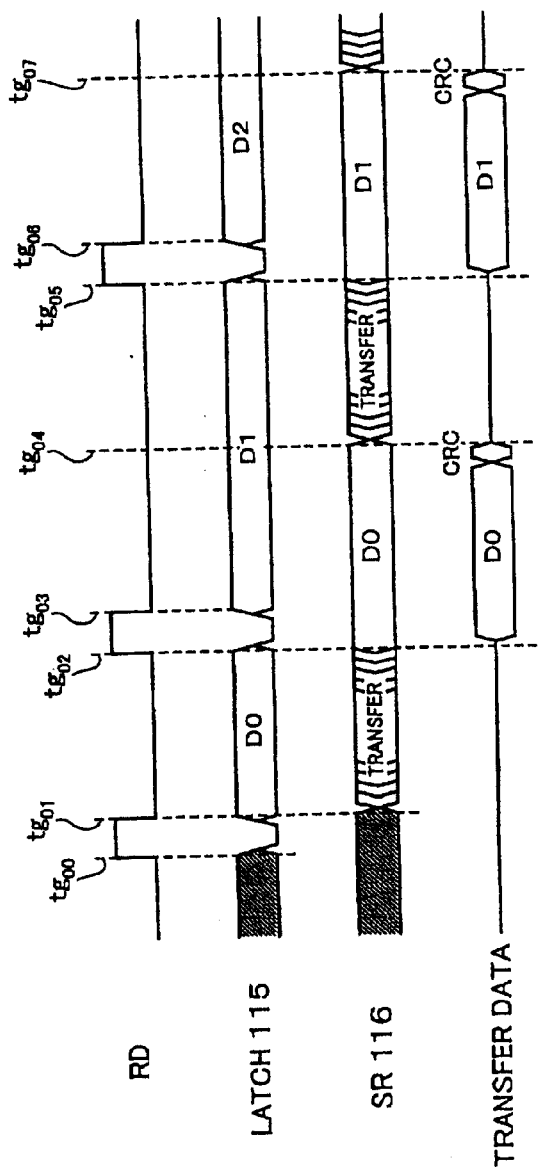
FIGS. 4A to 4D are timing charts for explaining an example of the transferring system using the conventional IC card.
Figure 5:
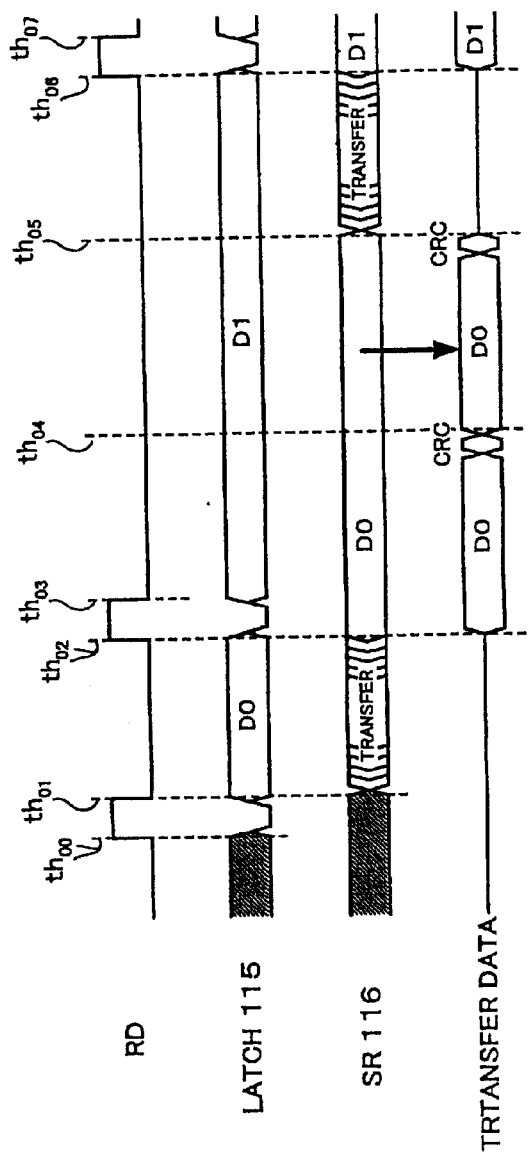
FIGS. 5A to 5D are timing charts for explaining an example of the transferring system using the conventional IC card.

Thus, the data transfer time becomes 16.5 MBytes/sec that is superior to the case of the structure shown in FIG. 2. However, the data transfer time is 82.3% of the case that the frequency of the transfer clock is 20 MHz.

According to the present invention, when data is not gaplessly read, a shift register and a switching circuit are disposed. The shift register stores data for one page for the data re-transfer process in the case that a transfer error takes place. The switching circuit switches between output data of a memory cell array and output data of the shift register depending on whether or not a transfer error takes place. When a transfer error does not take place, output data of the memory cell array is directly transferred. On the other hand, when a transfer error takes place, output data of the shift register is transferred. As a result, data can be transferred between the IC card and the host device at the logically maximum speed.

When data is gaplessly read, while data of the first half area of one page or data of the second half area of one page is being transferred, data of the second half area of one page or data of the first half area of one page is being firstly accessed to the memory cell array. As a result, data can be gaplessly read. In this case, a first shift register, a second shift register, and a switching circuit are disposed. The first shift register stores data of the first half area of one page for the data re-transfer process in the case that a transfer error takes place. The second shift register stores data of the second half area of one page for the data re-transfer process in the case that a transfer error takes place. The switching circuit switches between output data of the memory cell array and output data of the first and second shift registers. When a transfer error does not take place, the output data of the memory call array is transferred. When a transfer error takes place, output data of the first and second shift registers is transferred. As a result, when data is transferred between the IC card and the host device, data can be gaplessly read at the logically maximum speed.

In addition, according to the present invention, data of the second half area of one page is re-transferred from a data latch. As a result, the storage capacity of the shift register can be reduced to the half of one page.

In addition, according to the present invention, one page is unequally divided. As a result, the storage capacity of the shift register can be reduced to less than the half of one page.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A record medium composed of a nonvolatile memory, the nonvolatile memory having a nonvolatile memory cell array that is accessible page by page, a controlling portion for controlling the nonvolatile memory cell array, and an input/output portion for connecting the nonvolatile memory to an external device, the record medium comprising:

latching means for latching data for one page that is read from the memory cell array;

a shift register for storing data that is output from said latching means for a data re-transfer process in the case that a transfer error is detected;

switching means for switching between output data of said latching means and output data of said shift register; and controlling means for transferring data for each page that is output from the memory cell array through said switching means to the external device through the input/output portion, determining whether or not a transfer error takes place in the transferred data, and performing the data re-transfer process for the data when a transfer error takes place in the transferred data, wherein when the transfer error does not take place in the transferred data, said switching means is controlled so that output data of said latching means is transferred to the external device, and wherein when the transfer error takes place in the transferred data and the data re-transfer process is performed for the transferred data, said switching means is controlled so that the data for one page stored in said shift register is transferred to the external device.

2. A record medium composed of a nonvolatile memory, the nonvolatile memory having a nonvolatile memory cell array that is accessible page by page, a controlling portion for controlling the nonvolatile memory cell array, and an input/output portion for connecting the nonvolatile memory to an external device, the record medium comprising:

first latching means for latching data of the first half area of one page read from the memory cell array;

second latching means for latching data of the second half area of one page read from the memory cell array;

controlling means for controlling a read process of the memory cell array in such a manner that while data of the first half area of one page or data of the second half area of one page is being transferred, data of the second half area of one page or data of the first half area of one page is accessed;

a first shift register for storing data that is output from said first latching means for a data re-transfer process in the case that a transfer error is detected;

a second shift register for storing data that is output from said second latching means for the data re-transfer process in the case that a transfer error is detected;

switching means for switching between output data of said first latching means and said second latching means and output data of said first shift register and said second shift register; and controlling means for transferring data for each page that is output from the memory cell array through said switching means to the external device through the input/output portion, determining whether or not a transfer error takes place in the transferred data, and performing the data re-transfer process for the data when a transfer error takes place in the transferred data, wherein when the transfer error does not take place in the transferred data, said switching means is controlled so that output data of said first latching means and said second latching means is transferred to the external device, and wherein when the transfer error takes place in the transferred data and the data re-transfer process is performed for the transferred data, said switching means is controlled so that the data of the first half area of one page stored in said first shift register and the data of the second half area of one page stored in said second shift register are transferred to the external device.

3. A record medium composed of a nonvolatile memory, the nonvolatile memory having a nonvolatile memory cell array that is accessible page by page, a controlling portion for controlling the nonvolatile memory cell array, and an input/output portion for connecting the nonvolatile memory to an external device, the record medium comprising:

first latching means for latching data of the first half area of one page read from the memory cell array;

second latching means for latching data of the second half area of one page read from the memory cell array;

controlling means for controlling a read process of the memory cell array in such a manner that while data of the first half area of one page or data of the second half area of one page is being transferred, data of the second half area of one page or data of the first half area of one page is accessed;

a shift register for storing data that is read from said first latching means for a data re-transfer process in the case that a transfer error is detected;

switching means for switching between output data of said first latching means and said second latching means and output data of said shift register; and controlling means for transferring data for each page that is output from the memory cell array through said switching means to the external device through the input/output portion, determining whether or not a transfer error takes place in the transferred data, and performing the data re-transfer process for the data when a transfer error takes place in the transferred data, wherein when the transfer error does not take place in the transferred data, said switching means is controlled so that output data of said first latching means and said second latching means is transferred to the external device, and wherein when the transfer error takes place in the transferred data and the data re-transfer process is performed for the transferred data, said switching means is controlled so that the data of the first half area of one page stored in said shift register and the data of the second half area of one page stored in said second latching means are transferred to the external device.

4. The record medium as set forth in claim 3,
wherein the data for one page is unequally divided into data of the first half area of one page and data of the second half area of one page.

5. A data transferring method for a record medium composed of a flash memory for dividing a nonvolatile memory cell array that is accessible page by page into a first half area of one page and a second half area of one page and performing a gapless read process in such a manner that while data of the first half area of one page or data of the second half area of one page is being transferred, data of the second half area of one page or data of the first half area of one page is accessed, the method comprising the steps of:

accessing the data of the first half area of one page from the memory cell array and latching the data of the first half area of one page to first latching means;

transferring the data of the first half area of one page from the first latching means to an external device, storing the data of the first half area of one page to a first shift register for a data re-transfer process in the case that a transfer error is detected, accessing the data of the second half area of one page from the memory cell array, and latching the data of the second half area of one page to second latching means;

after the data of the first half area of one page has been transferred, transferring the data of the second half area of one page to the external device, storing the data of the second half area of one page to a second shift register for a data re-transfer process in the case that a transfer error is detected, and accessing data of the first half area of the next page from the memory cell array;

after the data of the first half area of one page and the data of the second half area of one page have been transferred to the external device, determining whether or not a transfer error takes place in the data for one page transferred to the external device;

when the transfer error is not detected, reading and transferring data for the next page; and when the transfer error is detected, transferring the data of the first half area of one page stored in the first shift register to the external device and transferring the data of the second half area of one page stored in the second shift register to the external device.

6. A data transferring method for a record medium composed of a flash memory for dividing a nonvolatile memory cell array that is accessible page by page into a first half area of one page and a second half area of one page and performing a gapless read process in such a manner that while data of the first half area of one page or data of the second half area of one page is being transferred, data of the second half area of one page or data of the first half area of one page is accessed, the method comprising the steps of:

accessing the data of the first half area of one page from the memory cell array and latching the data of the first half area of one page to first latching means;

transferring the data of the first half area of one page from the first latching means to an external device, storing the data of the first half area of one page to a shift register for a data re-transfer process in the case that a transfer error is detected, accessing the data of the second half area of one page from the memory cell array, and latching the data of the second half area of one page to second latching means;

after the data of the first half area of one page has been transferred, transferring the data of the second half area of one page to the external device and accessing data of the first half area of the next page from the memory cell array;

after the data of the first half area of one page and the data of the second half area of one page have been transferred to the external device, determining whether or not a transfer error takes place in the data for one page transferred to the external device;

when the transfer error is not detected, transferring data for the next page; and when the transfer error is detected, transferring the data of the first half area of one page stored in the first shift register to the external device and transferring the data of the second half area of one page latched in the second latching means to the external device.

7. The data transferring method as set forth in claim 6, wherein the data for one page is unequally divided into data of the first half area of one page and data of the second half area of one page.

* * * * *